United States Patent [19]

Kinoshita et al.

[11] Patent Number: 5,518,572
[45] Date of Patent: May 21, 1996

[54] PLASMA PROCESSING SYSTEM AND METHOD

[75] Inventors: Osamu Kinoshita, Chiba; Shigemi Murakawa, Sakura; Naoki Kubota, Ohta, all of Japan

[73] Assignee: Kawasaki Steel Corporation, Hyogo, Japan

[21] Appl. No.: 444,261

[22] Filed: May 18, 1995

Related U.S. Application Data

[63] Continuation of Ser. No. 200,566, Feb. 22, 1994, abandoned, which is a continuation of Ser. No. 896,371, Jun. 10, 1992, abandoned.

[30]  Foreign Application Priority Data

| Jun. 10, 1991 | [JP] | Japan | 3-165031 |
| Jun. 10, 1991 | [JP] | Japan | 3-165032 |
| Aug. 21, 1991 | [JP] | Japan | 3-233904 |
| Nov. 28, 1991 | [JP] | Japan | 3-339947 |
| Dec. 26, 1991 | [JP] | Japan | 3-357542 |
| Mar. 19, 1992 | [JP] | Japan | 4-063477 |

[51] Int. Cl.$^6$ .......................... C23C 16/50; H01L 21/00
[52] U.S. Cl. .......................... 156/345; 118/723 MP; 118/723 E; 118/723 ER
[58] Field of Search .......................... 156/345, 643; 204/192.32, 298.34, 298.38; 118/723 R, 723 E, 723 ER, 723 MP, 723 FI

[56]  References Cited

U.S. PATENT DOCUMENTS

| 4,123,663 | 10/1978 | Horiike | 204/298.38 X |
| 4,595,484 | 6/1986 | Giammarco et al. | 204/298.34 X |
| 4,859,303 | 8/1989 | Kalmitsky et al. | 156/345 X |
| 5,006,220 | 4/1991 | Hijikata et al. | 156/345 X |
| 5,082,685 | 1/1992 | Morooka | 204/298.38 X |

FOREIGN PATENT DOCUMENTS

| 0184220 | 6/1986 | European Pat. Off. . |
| 0230290 | 7/1987 | European Pat. Off. . |
| 0324247 | 7/1989 | European Pat. Off. . |
| 0443154 | 8/1991 | European Pat. Off. . |
| 61-248428 | 11/1986 | Japan . |
| 62-37382 | 2/1987 | Japan . |
| 62-174917 | 7/1987 | Japan . |
| 62-259443 | 11/1987 | Japan . |
| 63-318058 | 12/1988 | Japan . |

OTHER PUBLICATIONS

Tatsumi Mizutani et al., Neutral–Beam–Assisted Etching of $SiO_2$—A Charge–Free Etching Process—, *Jap. Journ. of Applied Physics*, Oct. 1990, vol. 29, No. 10, pp. 2220–2222.

S. O. Saied et al., The Development and Use of a Time-of-–Flight System to Analyse Energy Spectra Produced by a Fast Atom Beam Source, *Vacuum*, vol. 38, No. 6, pp. 469 to 473, 1988.

Primary Examiner—Nam Nguyen
Attorney, Agent, or Firm—Oliff & Berridge

[57]  ABSTRACT

An etching system contains a plasma chamber, a charge exchange chamber and a processing chamber. The charge exchange chamber and the processing chamber are partitioned with a porous plate provided with a number of fine linear microchannel holes. Positive ions generated by the plasma chamber are accelerated by an accelerating electrode in the charge exchange chamber, charge-exchanged and introduced as neutral particles through the microchannel holes into the processing chamber. Neutral particles are vertically entered into an object to be processed as neutral particle beams that are completely aligned by the microchannel holes. An object with a large surface area can be etched with high accuracy by making the porous plate a size which corresponds to the object. Thus, plasma processing with only neutral particles is carried out with high accuracy even when the surface area of the object is large.

13 Claims, 13 Drawing Sheets

5,518,572

PLASMA PROCESSING SYSTEM AND METHOD

This is a Continuation of application Ser. No. 08/200,566 filed Feb. 22, 1994, now abandoned, which in turn is a Continuation of application Ser. No. 07/896,371 filed Jun. 10, 1992, now abandoned.

BACKGROUND OF THE INVENTION

1. Field of the Invention

The present invention relates to a plasma processing system and method, particularly, a plasma processing system and method appropriately suitable to applications such as etching and film formation on a surface of an object to be processed by irradiating a neutral particle beam, which comprises only electrically neutral particles (atoms and molecules), onto the surface of the object to be processed.

2. Description of the Prior Art

One processing system which uses plasma is a dry etching system. This dry etching system has generally employed an etching method according to which a reactive gas is plasmatized by high frequency glow discharge (RF discharge) to produce ions and chemically active neutral species. These ions and neutral chemical species are transported to a surface of an object to be processed and reacted thereon, thereby the etching is carried out.

In the above described etching method, an object to be processed having a surface covered with an etching mask is set on a high frequency electrode. An action in an incident direction is accelerated by accelerating the positive ion in a direction vertical to the surface of the object with a negative bias potential induced on the surface of the object, thereby it is intended to attain high precision processing with high anisotropy faithful to the above etching mask.

In the above etching method, however, an isotropic etching with an undirectional radical (neutral chemical species) is simultaneously carried out since the above radical is electrically neutral. Therefore, a side etching also proceeds and it is difficult to attain a complete anisotropic form; for example, this side etching is a large problem in a fine work on semiconductors in terms of submicron.

To solve this side etching problem, there have been proposed a method for forming a protective film which prevents reactions on a side wall of a part to be processed (etched part), and a method for controlling a radical reaction on the side wall by lowering the temperature of an object to be processed or an etching method by producing a plasma with a higher ion density, a low pressure and a low radical density.

These methods use positive charged ions which are aligned in the direction. Therefore, since the direction of movement of the ions depends on the associated electric field, the following problems are expected in a fine pattern etching in terms of submicron.

FIG. 14 shows a part near the surface of an object 10 being etched and the surface of the object 10 to be processed is covered with the etching mask 12.

When the etching is proceeded as shown in FIG. 14, the incident direction of ion I is bent due to a disturbance (unevenness) of electric field E (shown with broken lines) along the surface of the object 10 to be processed and the ion I strikes against the side wall to cause side etching. Therefore, an expected anisotropy cannot be obtained and the etching accuracy deteriorates.

Further, at the etching parts 14, 16 and 18, the ion flux which reaches the bottom, for example, 14A, reduces and therefore the so-called micro loading effect (or RIE lag) is caused in which the etching speed on the etching parts (16 and 18 in the drawing) with fine patterns is slower than that on the etching part 14 with a wide pattern.

Furthermore, the ion has a large secondary electron emission coefficient and therefore, when the ion I strikes against the object 10 to be processed, the secondary electron emission takes place on the surface of the object 10 and the etching accuracy deteriorates.

In addition, when the ion is incident onto the surface of the object to be processed, a charge-up occurs on the insulation film since the ion has an electric charge, and a dielectric breakdown may be caused due to the charge-up to deteriorate the film quality and therefore there remains also a problem of reliability deterioration.

Accordingly, it is preferable for ensuring a favorable anisotropy, control of the micro loading effect and improvement of the reliability to carry out the etching with a neutral particle beam composed of active species which are electrically neutral with aligned directions and small secondary electron coefficients.

As a method for implementing a neutral particle beam which meets the above described object have been known a method disclosed in the Japanese Patent Laid Open No. Sho. 62-37382 and Sho. 62-174917 which, for example, uses electron attachment for obtaining a neutral particle beam by neutralizing the ion beam through the electron supply source (neutralizer) such as a filament and a method disclosed in the Japanese Patent Laid Open No. Sho. 61-248428, Sho. 62-174917 and Sho. 62-259443 which use a charge exchange reaction for obtaining a neutral particle beam composed of the radical and others by charge exchange of the same type of ion and radical.

However, the above method utilizing electron attachment cannot provide a sufficient beam flux since the probability of electron attachment is low and it is difficult to efficiently neutralize the ion beam. Therefore a method capable of eliminating such demerit uses a saddle field type ion source to allow improvement of the neutralizing efficiency to 90% or over by appropriately setting the conditions. (Vacuum, 38(6), 469 (1988), etc.)

In the case of the method using the above described charge exchange reaction, the neutralizing efficiency is low since the possibility of charge exchange reaction by incident ions is only once per ion. Therefore the Japanese Patent Laid Open No. Sho. 63-318058 discloses an art capable of raising the neutralizing efficiency by using an element such as Ne (neon) which is light but has a large cross section for charge exchange (ion neutralizing probability).

However, those methods for obtaining a high speed neutral particle beam by the above described charge exchange of ions and for obtaining a neutral particle beam by neutralization with electrons cannot produce a neutral particle beam with aligned directions (high directionality) in a wide area and therefore these methods accompany a problem that high accuracy processing such as etching cannot be achieved on an object with a large area.

In case of the method for obtaining a neutral particle beam by charge exchange of ions as described above, there is a problem that the collision frequency of ions in the charge exchange chamber is low since the charge exchange chamber where electric charges of ions are exchanged and the processing chamber where the object is processed with a neutral particle beam are kept in a substantially same low pressure condition of, for example, $10^{-3}$ Torr and therefore a sufficient charge exchange efficiency (the number of neutral particles produced to the number of ions introduced) cannot be obtained and the processing speed for the object to be processed is also low.

Further, a necessity for improving the charge exchange efficiency to increase the processing speed on an object to be processed encounters with a problem that the apparatus will be inevitably large in size because a sufficient ion flying distance should be ensured.

The method using the above described saddle field type ion source has a problem that the energy and flux of the neutral particle beam produced cannot be independently controlled, the energy of the beam obtained is relatively high (approximately 1 k eV or over) and the width of energy distribution is large.

The art disclosed in the above Japanese Patent Laid Open No. Sho. 63-318058 is disadvantageous in that the etching speed in the etching with a light element such as Ne is several times less than that in case of the etching with a heavier element such as Ar or Kr since the etching yield in the former case is small and consequently an increase of neutralizing efficiency is offset and the types of usable elements are limited.

The current art utilizing charge exchange reaction has a problem that the etching speed is low since the flux of neutral particle beam produced is small. If it is attempted to raise the etching speed to a practically available level to solve this problem, the energy of neutral particles is required to be approximately several hundreds of eV and an opposite effect against the general tendency to less energy. Accordingly, an important point to raise the etching speed to a practical level by a neutral particle beam generating method which utilizes charge exchange reaction is how to generate a low energy neutral particle beam as much as possible and increase the neutral particle beam flux.

The method utilizing the above charge exchange reaction is disadvantageous in that neutral particles as described above are less reactive when they are entered into the object to be processed and therefore a sufficient etching speed (depositing speed in case of film formation) cannot be obtained since neutral particles are only given translation energy.

SUMMARY OF THE INVENTION

The first object of the present invention made to solve the above described conventional problems is to provide a plasma processing system capable of implementing high precision plasma processing even on an object with a large area to be processed.

The second object of the present invention is to provide a plasma processing system capable of raising the charge exchange efficiency despite that the flying distance of ions is short and therefore an object can be processed with a neutral particle beam at a sufficiently high speed despite of a small size.

The third object of the present invention is to provide a plasma processing system capable of generating a high density and high speed neutral particle beam at a high neutralizing efficiency without any limitation which depends on the type of usable material gas.

The fourth object of the present invention is to increase the neutral particle beam flux by improving the efficiency of the charge exchange reaction in neutralizing ions extracted from the ion source.

The fifth object of the present invention is to further provide a plasma processing system capable of generating a highly reactive neutral particle beam.

The present invention provides a plasma processing system which comprises a plasma chamber having plasma generating means, a charge exchange chamber for neutralizing ions generated in the plasma chamber and a processing chamber for processing an object to be processed by irradiating neutral particles which are neutralized in the charge exchange chamber, wherein the charge exchange chamber and the processing chamber are partitioned with a porous plate which has a number of linear microchannel holes to permit fine particles to pass through from the charge exchange chamber into the processing chamber, thereby achieving the above described first object.

The present invention also provides a plasma processing system which comprises a plasma chamber having plasma generating means, a charge exchange chamber for neutralizing ions generated in the plasma chamber and a processing chamber for processing an object to be processed by irradiating neutral particles which are neutralized in the charge exchange chamber, wherein the charge exchange chamber is provided with pressure adjusting means for producing a higher pressure in the charge exchange chamber than in the processing chamber, thereby achieving the above described second object.

The present invention also provides a plasma processing system which comprises an ion source, a charge exchange chamber for neutralizing ions extracted by the ion extraction electrode from the ion source and a processing chamber for processing an object to be processed by entering incident neutral particles generated in the charge exchange chamber, wherein the charge exchange chamber is provided with means for controlling the velocity of ions, thereby achieving the above described third object.

The present invention also provides a plasma processing system which comprises an ion source, a charge exchange zone for neutralizing ions extracted from the ion source and a processing chamber for processing an object to be processed by entering incident neutral particles generated at the charge exchange zone, wherein the ion source and the charge exchange zone are respectively provided with gas supplying parts from which a material gas and a charge exchange gas can be independently supplied to the ion source and the charge exchange zone, thereby achieving the above described fourth object.

The present invention also provides a plasma processing system which comprises an ion source, a charge exchange chamber for neutralizing ions extracted from the ion source and a processing chamber for processing an object to be processed by entering incident neutral particles generated at the charge exchange chamber, wherein the charge exchange chamber is provided with means for exciting neutral particles generated, thereby achieving the above described fifth object.

The present invention also provides a plasma processing method, which comprises an ion source, a charge exchange zone for neutralizing the ions extracted from the ion source and a processing chamber for processing an object to be processed with incident neutral particles generated from the charge exchange zone, wherein the ion source and the charge exchange zone are respectively provided with the gas supplying parts, the plasma processing system is capable of independently supplying the material gas and the charge exchange gas to the ion source and the charge exchange zone, wherein a gas with a larger ionization potential than the charge exchange gas to be supplied to the charge exchange zone as the material gas is supplied to the ion source, thereby similarly achieving the above described fourth object.

The present invention also provides the above described plasma processing system in which the charge exchange chamber and the processing chamber are partitioned with porous plates which are provided with a number of fine linear through holes, thereby further certainly achieving the above described objects.

The present invention also provides the above described plasma processing system in which the electrode is formed at least at one side of the above described porous plate for partitioning the charge exchange chamber and the processing chamber.

The present invention also provides the above described plasma processing system which is provided with a radical supply source in the processing chamber.

The present invention also provides the above described plasma processing system in which the ion extraction electrode is formed with a multilayer plate which is made in a double construction with a dielectric and a metal provided with an opening for extraction of ions.

The present invention also provides the above described plasma processing system in which a neutralizer for neutralizing space charge is provided.

The present invention also provides the above described plasma processing system in which an apparatus for controlling the temperature of an object to be processed is provided.

The present invention also provides the above described plasma processing system in which the processing chamber are arranged at both sides of the charge exchange chamber.

The present invention also provides exciting means for exciting the charge exchange gas at the gas supply part provided in the charge exchange zone.

In the present invention, the charge exchange chamber and the processing chamber are partitioned with a porous plate provided with a number of linear microchannel holes through which fine particles such as neutral particles can pass and of which directions are aligned. The ions introduced from the plasma chamber are charge-exchanged in the charge exchange chamber and neutral particles such as radicals generated can be introduced into the processing chamber through the above described microchannel holes. Thus, a neutral particle beam with an extremely high directionality can be generated over the whole area where microchannel holes are formed in the processing chamber. Accordingly, high precision plasma processing can be carried out even for an object to be processed with a large area by making a porous plate in a size in accordance with the area of the object to be processed.

The present invention also allows the pressure Pa of the charge exchange chamber 22 to be higher than the pressure Pb of the processing chamber 24 (Pa>Pb) as later shown in FIG. 1 and therefore the pressure Pa in the charge exchange chamber can be higher than ever. Accordingly, the collision frequency of ions, which fly in the charge exchange chamber, with neutral particles such as the radicals can be substantially increased and the charge exchange efficiency of ions can be vastly improved.

Consequently, even if the flying distance of ions, that is, the length of the charge exchange chamber in the direction where the ions fly, is reduced, the charge exchange efficiency of ions can be improved better than ever and the plasma processing system can be made compact.

Since the pressure of the processing chamber 24 can be low even though the pressure of the charge exchange chamber 22 is to be high, the neutral particles can be irradiated onto the object to be processed without causing scattering due to collision of particles and stabilization by which the radicals such as atoms or the like become molecules and highly reliable precision etching is enabled.

In the present invention, the charge exchange chamber in which charge exchange reaction is carried out is provided with ion velocity control means for controlling the velocity of ions to allow to accelerate even the ions, which do not have a translation energy produced by the charge exchange reaction, by an electric field and also allow again the charge exchange reaction. This reaction is repeated a plurality of times in accordance with the size and pressure of the charge exchange chamber and the acceleration energy of ions and therefore the neutralization efficiency can be substantially improved and consequently a high speed neutral particle beam can be efficiently generated.

The charge exchange chamber and also the plasma processing system itself can be made compact owing to improvement of the neutralization efficiency.

The following describes the principle for achieving the above fourth object by providing the gas supply parts respectively at the ion source and the charge exchange zone so that material gas and charge exchange gas from these gas supply parts can be independently supplied to the ion source and the charge exchange zone.

Assuming that a micro space having a unit sectional area and length dl is filled with gas of pressure P and an ion flux of density N and velocity u passes through this space, the continuity equation regarding the ions can be expressed as the equation (1) given below:

$$d(Nu)/dl = -R \tag{1}$$

R of the right side of the above equation (1) denotes the density reducing speed of ions which have disappeared through the charge exchange reaction, that is, the charge exchange reaction speed, which is proportional to the ion flux, gas pressure P and the cross section $\sigma$ for charge exchange. This charge exchange reaction speed can be expressed as the equation (2). In this case, k is a proportional constant.

$$R = k\sigma N u P \tag{2}$$

If the ion flux is defined as F=Nu, the ion flux F which has passed through the charge exchange zone (charge exchange chamber) of length 1 can be expressed as the equation (3) according to the equations (1) (2). In this case, $F_0$ denotes the initial ion flux.

$$F = F_0 \exp(-k\sigma Pl) \tag{3}$$

From the above equation (3), it is known that the ion flux decreases simultaneously with length l of the charge exchange zone and, in turn, the high speed neutral particle flux ($F_0$−F) increases simultaneously with length l of the charge exchange zone. If the charge exchange efficiency $\eta$ is defined as a ratio of ions which are converted to high speed neutral particles at the charge exchange zone, $\eta$ is expressed as the equation (4).

$$\eta = 1 - \exp(-k\sigma Pl) \tag{4}$$

From the equation (4), it is known that the cross section for charge exchange, pressure and the length for charge exchange should be increased to improve the charge exchange efficiency.

Conventionally, it has been reported that the charge exchange reaction has the largest cross section in case of resonant charge exchange reaction with the same type of ion and atom such as $Ar^+$ and Ar. However, the results of studies through various experiments conducted by the inventors of the present invention and others found out that, if a combination of ions and neutral particles is appropriately selected and the ions and neutral particles are separately supplied to the ion source and the charge exchange zone, the cross section of this case is larger than that of resonant charge exchange. Particularly, it is found out that, if the ionization potential of gas to be supplied to the ion source is larger than that of gas to be supplied to the charge exchange zone, the charge exchange cross section will be extremely large.

For example, Table 1 shown later indicates the charge exchange cross sections, which are obtained by measuring the charge exchange reaction efficiency as to gases such as Ar, $F_2$, $Cl_2$, $Br_2$ and Xe, as relative values in reference to the values in case of charge exchange reaction of $Ar^+$ and Ar which are defined as 1. From the results shown in Table 1, it is understood that gases of atoms and ions having lager radii have a larger cross sections of reaction since the charge exchange cross section in case of $Ar^+$ and Ar is larger than in case of $Xe^+$ and Xe.

Further, Ar of a large ionization potential has a larger reaction cross section for any neutral particle than $Cl^+$ despite that $Cl^+$ and $Ar^+$ have the almost same ion radii. In addition, in a combination of $Ar^+$ ion and other gas, a large reaction cross section is obtained in the order of F2 (Ar)<$Cl_2$<$Br_2$ (Ar and $F_2$ are substantially equal) owing to a synergistic effect of the difference of ionization potentials and the sizes of neutral particles.

When the gas excited by a microwave (exciting means) was supplied to the charge exchange zone, the charge exchange efficiency in case of any kind of gas was improved better than in the case that the gas was not excited by the microwave. For example, in the charge exchange reaction with the same type of gases such as $Ar^+$ and Ar, the result that the charge exchange efficiency would be improved was obtained by supplying Ar to the charge exchange zone after exciting it by a microwave or the like. It is understood that this is because the ionization potential of excited molecule is smaller than a stable molecule.

This phenomenon coincides with the above described results of experiments that the charge exchange efficiency will be more improved as the ionization potential of gas to be supplied to the ion source is larger than that of gas to be supplied to the charge exchange zone. In addition, this phenomenon is observed regardless of the types of gases to be supplied to the ion source and the charge exchange zone and therefore is similarly observed even in the case that the material gas to be supplied to the ion source and the charge exchange gas to be supplied to the charge exchange zone are of the same type.

The present invention made according to the above described knowledge allows the selection of appropriate material gas and charge exchange gas from various gases including the types of gases listed in Table 1 by providing the gas supply parts respectively at the ion source and the charge exchange zone to permit independent supplying of the material gas and the charge exchange gas from these gas supply parts to the ion source and the charge exchange zone and also allows to improve the charge exchange reaction efficiency by selecting an appropriate combination of these material gas and charge exchange gas.

In this case, the charge exchange reaction efficiency can be further improved by using a gas with a higher ionization potential than the charge exchange gas to be supplied to the charge exchange zone as the material gas to be supplied to the ion source.

In addition, in the present invention, the charge exchange efficiency can be further improved and a higher density neutral particle beam flux can be generated by providing an exciting means for exciting the charge exchange gas at the gas supply part provided at the charge exchange zone.

According to the present invention, a neutral particle exciting means for exciting neutral particles is provided in the charge exchange chamber where neutral particles are generated by the charge exchange reaction and therefore neutral particles, which only have the translation energy produced from the charge exchange reaction, can be excited to make the internal energy kept at a high level. Accordingly, the energy can be efficiently applied to the object to be processed and the reaction can be substantially promoted by entering the neutral particles with such high internal energy into the object to be processed.

If the charge exchange chamber and the processing chamber are partitioned with a porous plate having linear fine through holes, neutral particles generated in the charge exchange chamber can be introduced into the processing chamber through the above described through holes and therefore a high speed neutral particle beam with better aligned directions can be generated.

In this case, the pressure of the charge exchange chamber can be higher than that in the processing chamber and therefore the charge exchange efficiency can be further improved and the neutralization efficiency can be further raised.

In addition, in this case, the pressure of the processing chamber can be low even though the pressure of the charge exchange chamber is kept at a high level and therefore neutral particles can be irradiated onto the object to be processed and highly reliable precision etching etc. can be carried out without causing collision and scattering of particles and stabilization in which the radicals of atoms are transformed to molecules in the processing chamber.

If electrodes are provided on one or both sides of the above described porous plate, these electrodes can be used as an electrode which forms an ion velocity control means and an ion repellent electrode and therefore the plasma processing system can be more compact.

If a radical supply source for supplying radicals is provided in the processing chamber, the object to be processed can be processed, for example, etched while the radicals are being absorbed by the object to be processed and the processing rate can be greatly raised accordingly.

If an apparatus for controlling the temperature of the object to be processed is provided, the object to be processed can be controlled to an appropriate temperature and therefore high precision processing can be performed.

If an ion extraction electrode is made as a multilayer plate which is provided with an opening for extracting ions and comprises a dielectric and a metal in a double construction, the service life of the ion extraction electrode can be further extended by arranging the dielectric at the ion source side.

If a neutralizer for neutralizing space charge is provided, the ion extraction efficiency can be raised and divergence of the ion beam can be prevented by providing the neutralizer neap the position where ions are extracted.

If two processing chambers are arranged respectively at both sides of the charge exchange chamber, the processing can be carried out in both processing chambers at the same time and therefore the processing efficiency can be raised.

The present invention allows high precision plasma processing only with neutral particles even on an object with a large area.

The present invention also allows to construct the plasma processing system for processing an object to be processed with a neutral particle beam as a compact system since the charge exchange efficiency can be raised even though the ion flying distance in the charge exchange chamber is reduced.

The present invention also allows to cause again the charge exchange reaction of ions since even ions which do not have the translation energy produced by the charge exchange reaction in the charge exchange chamber can be accelerated and generate a high speed neutral particle beam at a high neutralization efficiency without limitation due to the type of material gas. Since the charge exchange efficiency can be improved even if the ion flying distance in the charge exchange chamber is reduced, the charge exchange chamber can be made more compact and further the plasma processing system can be made compact. The apparent neutralization efficiency can be 100% or over.

The plasma processing speed for the object can be substantially improved by providing the radical supply source in the processing chamber.

The present invention also allows to generate a high density and high speed neutral particle beam since the charge exchange efficiency can be raised by expanding the cross section for charge exchange in neutralizing ions extracted from the ion source and therefore vastly raise the plasma processing speed. Consequently, etching capable of ensuring low damage, high anisotropy, high selectivity and high dimensional controllability is allowed using the neutral particle beam, thus enabling to manufacture semiconductor devices in terms of deep submicron.

The present invention also allows to increase the internal energy of neutral particles since neutral particles which have only translation energy produced from the charge exchange reaction in the charge exchange chamber can be excited and efficiently supply the energy to the object to be processed by irradiating such neutral particles to the object, thus greatly promoting reactions. Accordingly, the etching rate and the film growing rate can be largely raised.

BRIEF DESCRIPTION OF THE DRAWINGS

The above and other objects, features and advantages of the present invention will be more apparent from the following description taken in connection with the accompanying drawings, in which.

DETAILED DESCRIPTION OF THE PREFERRED EMBODIMENT

The preferred embodiments of the present invention are described below in detail, referring to the accompanying drawings.

Figure 1:
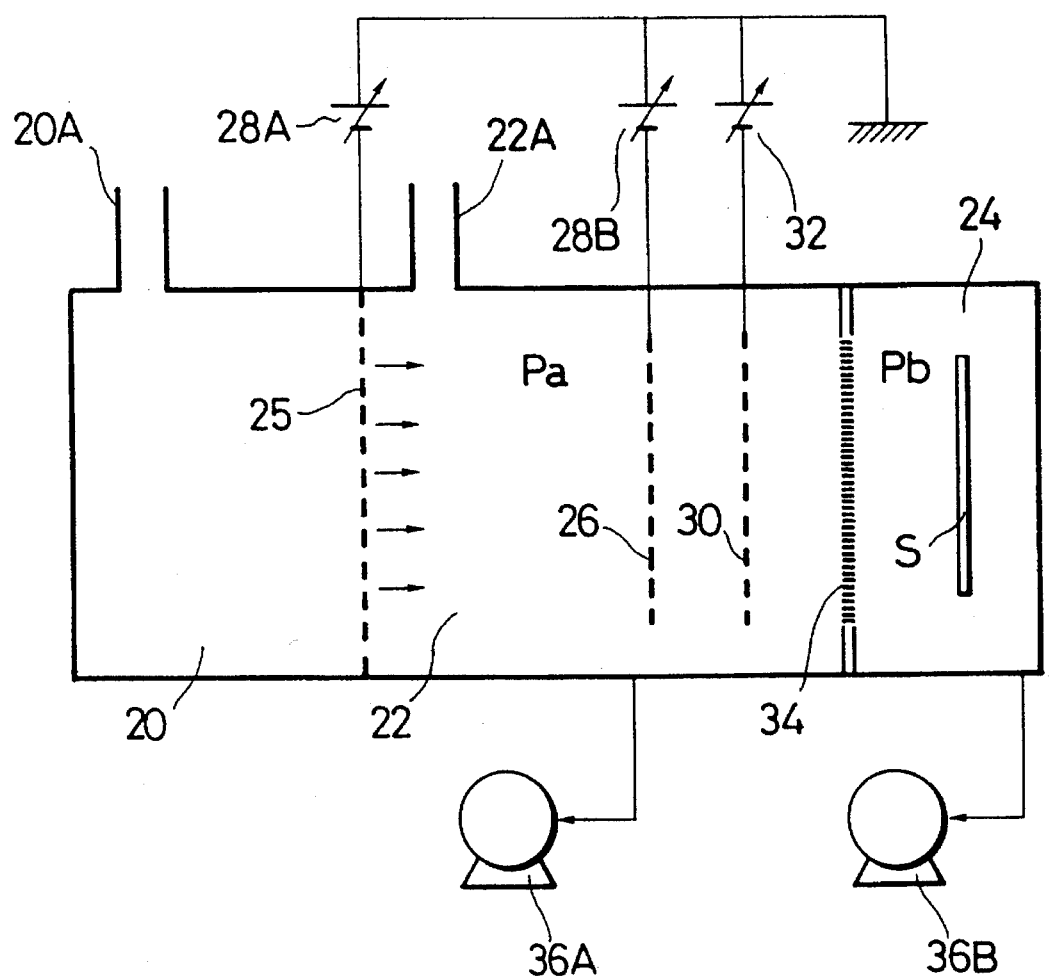
FIG. 1 is a rough configuration diagram conceptually showing the etching system (plasma processing system) of the first embodiment according to the present invention.

FIG. 1 is a rough construction diagram conceptually showing an etching system (plasma processing system) of the first embodiment according to the present invention.

The etching system of this embodiment is provided with a plasma chamber (ion source) 20 having plasma generating means (not shown), a charge exchange chamber 22 for generating neutral particles such as radicals and so on by neutralizing positive ions generated in the plasma chamber 20 through charge exchange, and a processing chamber 24 for etching (plasma processing) an object S to be processed with neutral particles generated from the charge exchange reaction.

The above described plasma chamber 20 is provided with a gas supply port 20A for supplying gas as plasma material.

An ion extracting electrode (grid electrode) 25 made of graphite for extracting ions from the plasma chamber 20 to the charge exchange chamber 22 is disposed between the plasma chamber 20 and the charge exchange chamber 22.

The charge exchange chamber 22 is provided with a gas supply port 22A for supplying charge exchange gas and a mesh type accelerating electrode 26, which is opposed to the ion extracting electrode 25, for accelerating positive ions extracted from the plasma chamber 20. The ion extracting electrode 25 and the accelerating electrode 26 are respectively connected to the ion accelerating power supplies 28A and 28B for applying an optional voltage across both electrodes in a direction where the ions are accelerated.

The charge exchange chamber 22 is provided with a mesh type ion repellent electrode 30 in parallel with the accelerating electrode 26 to allow to return the ions which have passed through the accelerating electrode 26 in a reverse direction. In the drawing, 32 denotes a variable power supply for applying a desired voltage to the ion removing electrode 30.

A porous plate (hereafter also referred to as the "microchannel plate") 34 is provided between the charge exchange chamber 22 and the processing chamber 24 to partition these chambers and the microchannel plate 34 allows neutral particles generated by the charge exchange chamber 22 so that neutral particles may be supplied to the processing chamber 24. In other words, the microchannel plate 34 is provided with a number of linear microchannel holes (fine through holes) 34A each of which extends in the direction of thickness as shown in an exploded partial magnified view of FIG. 2. Neutral particles such as radicals can pass through these microchannel holes 34A from the charge exchange chamber 22 to the processing chamber 24.

The microchannel plate 34 can be formed with a shower nozzle type thin quartz which comprises an assemblage of hollow glass fibers each having a hole of, for example, approximately a few micron meters to 100 µm in diameter and its thickness 1 can be several hundreds of µm to a few millimeters.

The processing chamber 24 is constructed to fix the object S to be processed with a holder which has a temperature control unit to ensure that the object S is processed at a specified temperature at all times. This is described referring to FIG. 3.

Figure 3:
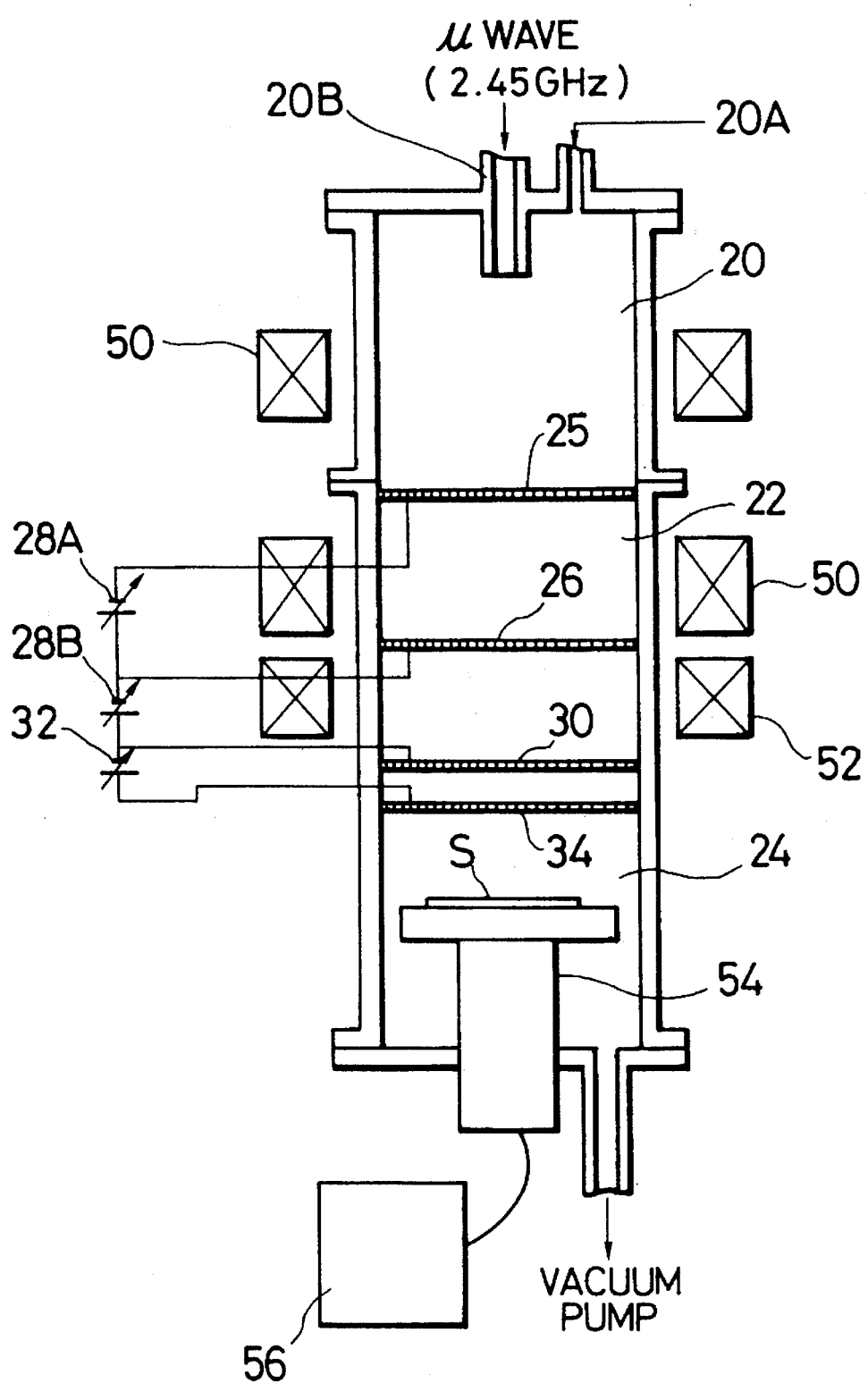
FIG. 3 is a rough sectional view showing a semi actual configuration of the above etching system.

FIG. 3 is a rough sectional view showing a substantially actual system which is lengthwisely placed. The plasma chamber 20 is provided with a waveguide 20B for introducing a µ wave of, for example, 2.45 GHz and magnets 50 for ERC are arranged around the plasma chamber 20. Magnets 50 for ERC are also disposed around the charge exchange chamber (charge exchange zone) 22 and control magnets 52 are disposed around the charge exchange chamber (charge exchange zone). In the processing chamber 24, a board holder 54 for supporting and fixing the object S to be processed is installed and connected to the thermostatic unit 56 by which the object S to be processed can be controlled, as required, to, for example, −100° C. to 80° C.

The following describes the operation of this embodiment.

A reactive gas such as clorine ($Cl_2$) is supplied as plasma material from the gas supply port 20A to the plasma chamber 20 to set the plasma chamber to a condition which allows generation of the plasma in the plasma chamber 20. A specified voltage to accelerate positive ions in the direction of the processing chamber 24 is applied between electrodes 25 and 26 by adjusting the power supplies 28A and 28B, and a potential which enables the pushing back of incident positive ions into the microchannel plate 34 is applied from the power supply 32 to the ion repellent electrode 30. Under this condition, the plasma is generated in the plasma chamber 20.

If the plasma is generated under a pressure of approximately $10^{-1}$ Torr, e.g., in the case that clorine gas is used as plasma material, neutral radicals such as $Cl^+$ chlorine ion and chlorine atom (Cl•) are generally produced in the plasma. In this plasma, the densities of a stable molecule ($Cl_2$), ions and neutral radicals depend on the discharging system and the pressure of the plasma chamber 20 while, in RF discharge, the ratio of neutral radicals/ions is approximately $10^3$ and abundant neutral radicals are contained.

In the plasma generated under the above described condition, the original densities of chlorine molecules, neutral radicals and ions have been observed to be approximately $3 \times 10^{14}$ pcs/cm², $5 \times 10^{12}$ pcs/cm², and $1 \times 10^{10}$ pcs/cm².

In this embodiment, positive ions in the plasma, which are extracted by the ion extracting electrode 25, are accelerated by the accelerating electrode 26 in the charge exchange chamber 22 and move toward the processing chamber 24. During this movement, charge exchange is carried out and the ions are electrically neutralized and high speed neutral particles of which directions are aligned are obtained.

In this case, ions which do not have translation energy are generated by the charge exchange reaction in the charge exchange chamber 22. The charge exchange can be carried out again by accelerating even such ions by the accelerating electrode 26 to efficiently obtain neutral particles and therefore the neutralizing efficiency can be greatly improved.

Neutral particles generated in the charge exchange chamber 22 move in the direction of the microchannel plate 34 under the condition that they are kept to have high speed and substantially aligned directions and pass through the microchannel holes 34A. In this case, the extension directions of microchannel holes 34A are precisely aligned and therefore the directions of neutral particles are further aligned by the microchannel holes 34A. Consequently, neutral particles are introduced into the processing chamber 24 as neutral particle beams of which directions are completely aligned (directionality is extremely high).

On the other hand, though neutral particles (such as radicals) in the plasma, which are electrically neutral, will not be accelerated by the both electrodes 25 and 26, they move in the charge exchange chamber 22, pass through the microchannel holes 34A as the neutral particles generated by charge exchange and are introduced into the processing chamber 24 as being aligned in the direction.

As described above, in this embodiment, the neutral particles in the plasma as well as positive ions can be introduced through the microchannel holes 34A after charge exchange and a number of neutral particles can therefore be entered into the processing chamber 24 as the neutral beams with extremely high directionality. Accordingly, the processing speed can be improved substantially.

The microchannel holes 34A are arranged vertically to the microchannel plate 34 and therefore the neutral particle beams of high directionality can be irradiated to be vertical to the surface of the object S to be processed over the area where the microchannel holes 34A are formed by arranging the object S to be in parallel to the microchannel plate 34. For this reason, the etching only with neutral particles can be carried out with high accuracy on the whole surface of the object S.

The charge exchange chamber 22 which is provided with the ion repellent electrode 30, is able to certainly prevent the ions from being introduced into the processing chamber 24 and consequently the object S can be etched only with complete neutral particles.

In this embodiment, as in the second embodiment described in detail in the following, the pressure Pa of the charge exchange chamber 22 can be larger than the pressure Pb of the processing chamber 24 and therefore the frequency of collision of ions with neutral particles such as radicals in the charge exchange chamber 22 can be increased and the charge exchange efficiency of ions can also be raised. Consequently, this embodiment is advantageous in that high precision etching only with neutral particles can be done even though the length of the charge exchange chamber 22 is short or the etching system is small-sized.

In addition, even when the pressure of the charge exchange chamber 22 is set to be high to raise the charge exchange efficiency as described above, the pressure of the processing chamber 24 can be lower than in the charge exchange chamber 22 and scattering of fine particles flowing into the processing chamber 24 through the microchannel plate 34 by collision with particles such as gas in the processing chamber 24 can be prevented.

For example, if the pressure of the processing chamber 24 is set at $10^{-3}$ Torr, the mean free path of gas under this condition is approximately 10 cm. If the clearance between the microchannel plate 34 and the object S to be processed is set to approximately 1 cm, almost all neutral particles which have passed the microchannel holes 34A are not scattered and therefore the neutral particles can be made incident to the surface of the object S as the neutral particle beams which are aligned in the direction.

According to this embodiment, as described above, since the microchannel holes 34A are linear and normal to the surface of the object S, the neutral particles in the plasma generated in the plasma chamber 20 as well as positive ions can be made vertically incident to the surface of the object S as the direction-aligned neutral particle beams.

Thus, the object S can be etched with the direction-aligned neutral radicals which are made vertically incident to the surface of the object S and therefore the etching of high anisotropy is allowed. Besides, a micro loading effect can be prevented since ions are not entered and therefore an extremely high precision etching pattern with high anisotropy can be formed.

Neutral particle beams can be irradiated onto the overall surface of the object S by forming the microchannel plate 34 in a size corresponding to the area of the object S. That is to say, forming the microchannel holes 34A over a wider range of the processing area of the object S and a highly anisotropic etching can be carried out on the object S as a whole even though the processing area is large.

The effects of this embodiment are described with a practical example.

The etching system used is provided with the microchannel plate 34 of approximately 160 mm in diameter and approximately 1 mm in thickness 1 having the microchannel holes 34A with diameter d of approximately 12 μm.

A 6-inch silicon wafer with a resist serving as an etching mask deposited on its surface is used as the object S to be processed and it is arranged in parallel to the microchannel plate 34 with a clearance of approximately 1 cm between the surface of the silicon wafer (etching surface) and the surface of microchannel plate 34.

The silicon wafer was etched under the condition that chlorine was introduced into the plasma chamber 20, discharging was conducted when the pressure Pa of the charge exchange chamber would be approximately $10^{-2}$ Torr, the pressure Pb of the processing chamber 24 was set to approximately $10^{-3}$ Torr, a specified voltage was applied between the ion extracting electrode 25 and the accelerating electrode 26, and a specified potential capable of preventing ions from being irradiated into the microchannel holes 34A was applied to the ion repellent electrode 30.

As a result, the silicon wafer could be etched as a whole as the mask pattern of high anisotropy. The etching speed was high and the etching did not depend on the density of the pattern (etching part) and the micro loading effect was not observed. In addition, any deterioration of the film quality due to a charge-up was not observed since the etching was carried out only with neutral particles.

The following describes in detail the etching system (plasma processing system) of the second embodiment according to the present invention.

The etching system of this embodiment is substantially the same as the first embodiment except that the the pressure of the charge exchange chamber 22 is set higher than that of the processing chamber 24. Therefore the following description refers to FIG. 1.

In this embodiment, as in the first embodiment, a porous plate (hereafter also referred to as the "microchannel plate") 34 is provided between the charge exchange chamber 22 and the processing chamber 24 to partition these two chambers and the pressures of the above two chambers 22 and 24 can be adjusted by this microchannel plate 34 and independently provided vacuum pumps 36A and 36B and therefore the pressure Pa of the charge exchange chamber 22 can be set higher than the pressure Pb of the processing chamber 24. In other words, as in the first embodiment, the microchannel plate 34 allows to independently adjust the pressures of the charge exchange chamber 22 and the processing chamber 24 since the diameter d of the microchannel holes 34A is extremely small as a few micron meters to approximately 100 μm.

The operation of this embodiment is described below.

As in case of the first embodiment, when a plasma is generated in the plasma chamber 20, positive ions in the plasma are electrically neutralized to become high speed neutral particles which are direction-aligned. When passing through the microchannel holes 34A, the neutral particles are further direction-aligned at the microchannel holes 34A and introduced as the extremely direction-aligned (excellent directionality) neutral particle beams into the processing chamber 24. In this case, since the microchannel holes 34A are formed normal to the microchannel plate 34, the neutral particle beams with higher directionality can be irradiated perpendicularly onto the surface of the object S by arranging the object S to be normal to the microchannel holes 34A. Accordingly, high precision etching is available for the object S as in the first embodiment.

In this embodiment, the pressure Pa of the charge exchange chamber 22 is set higher than the pressure Pb of the processing chamber 24 and therefore the frequency of collision of ions with neutral particles such as radicals in the charge exchange chamber 22 can be increased and the charge exchange efficiency of ions can be vastly improved.

Consequently, a long flying distance of ions as conventional is unnecessary to improve the neutralization efficiency of ions to approximately 100% and therefore the length of the charge exchange chamber 22 in the ion flying direction can be reduced or the distance between the plasma chamber 20 and the processing chamber 24 can be reduced to be close to each other, and the charge exchange chamber 22 and further the etching system can be made compact.

After a silicon wafer on the surface of which an etching mask is mounted was set as the object S to be processed at the specified position in the processing chamber 24, using the etching system according to the present invention, chlorine gas ($Cl_2$) was supplied from the gas supply port 20A to generate the plasma, and the charge exchange chamber 22 was set to approximately $10^{-1}$ Torr and the processing chamber 24 was held at approximately $10^{-3}$ Torr to prevent scattering of the beams.

Positive ions ($Cl^+$ and $Cl2^+$) from the plasma chamber 20 were accelerated and extracted to the charge exchange chamber 22 and furthermore the charge exchange reaction was conducted while accelerating the ions by the accelerating electrode 26.

Consequently, a neutral particle beam of a low energy as several hundreds of eV could be generated by adjusting the voltage across the ion extracting electrode 25 and the accelerating electrode 26. The apparent neutralizing efficiency (the percentage of neutral particles produced from one ion) in this case could be 100% or over despite that the system includes the charge exchange between different elements with a small cross section for charge exchange. In this case, the ions which have passed the accelerating electrode 26 are returned again to the charge exchange chamber 22 by the ion repellent electrode 30 and the ions were not irradiated into the processing chamber 24.

Even though the length of the charge exchange chamber 22 in a direction where the ions are accelerated is a few centimeters, the apparent charge exchange efficiency could be close to 100% and, at the same time, high precision etching with high anisotropy could be carried out for the silicon wafer by appropriately controlling the temperature of the wafer. In this embodiment, the ion removing electrode 30 is not always required.

Figure 4:
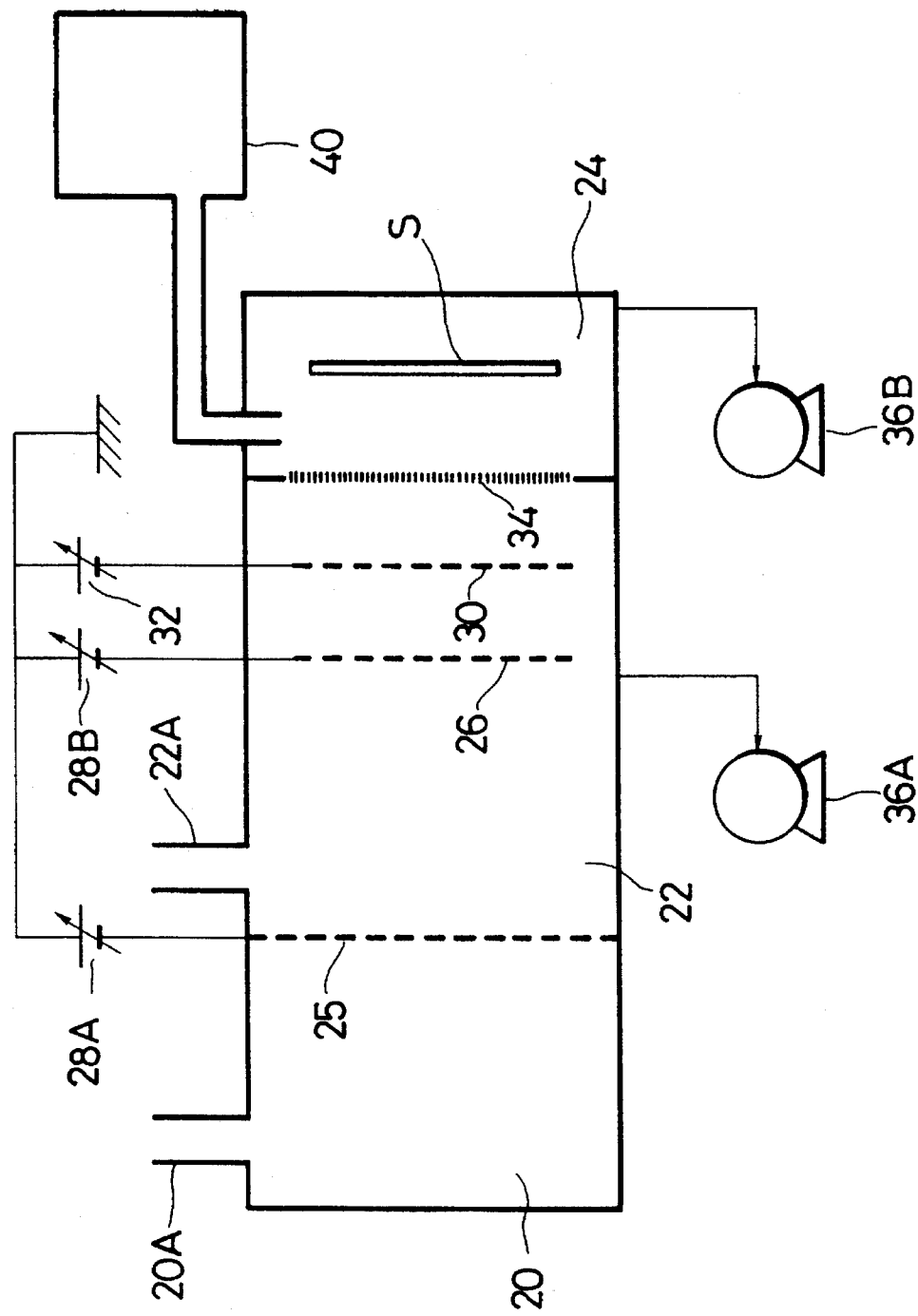
FIG. 4 is a rough configuration diagram showing the plasma processing system of the third embodiment according to the present invention.

FIG. 4 shows a rough construction of the etching system of the third embodiment according to the present invention.

The plasma processing system of this embodiment is substantially the same as the etching system of the first embodiment except that the processing chamber 24 is provided with a radical supply source 40 for supplying the radicals such as Cl radical into the processing chamber 24.

The radical supply source 40 allows the generation of radicals by dissociating gases through discharging. This radical supply source 40 can be a type capable of dissociating gases by appropriate means such as light, heat or the like.

In this embodiment, chlorine gas was dissociated in the radical supply source 40 by microwave discharging of 2.45 GHz; The Cl radical produced was adsorbed onto the surface of the silicon wafer S, chlorine gas was supplied from the gas supply port 20A to the plasma chamber 20 and also from the gas supply port 22A to the charge exchange chamber 22, and etching was carried out under conditions almost identical to those in the first embodiment.

According to the present invention, the silicon wafer S can be etched with the Cl neutral particle beam while adsorbing the Cl radical onto the silicon wafer S and the etching rate could be raised several times as high as that in the first embodiment.

Figure 5A:
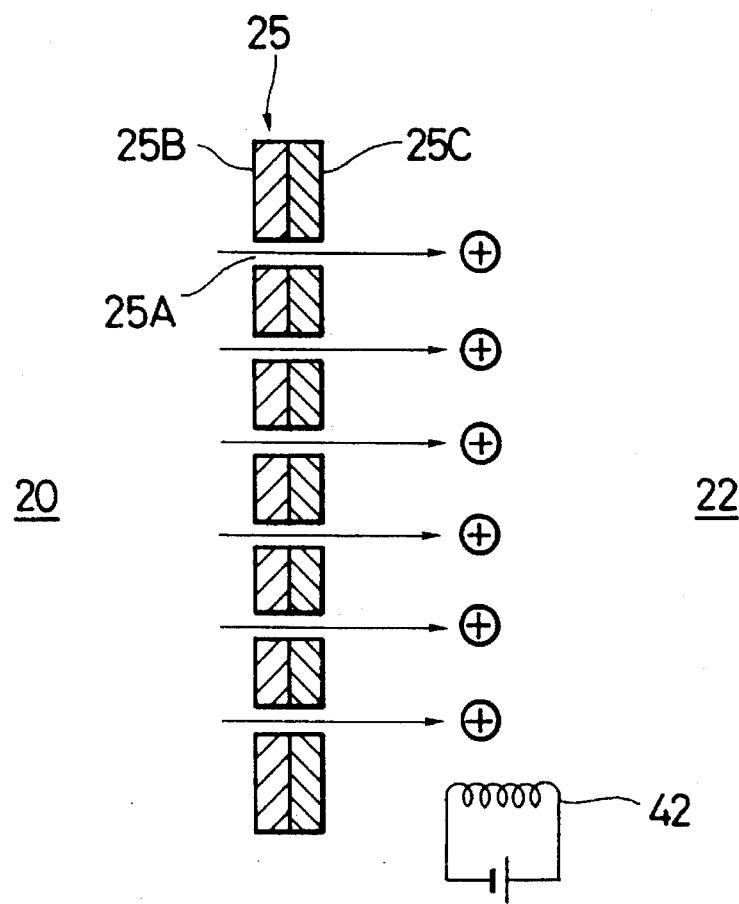
FIGS. 5(A) and 5(B) are respectively a magnified partial sectional view showing the principal part of the plasma processing system and a rough perspective view showing the ion extracting electrode of the fourth embodiment according to the present invention.
Figure 5B:
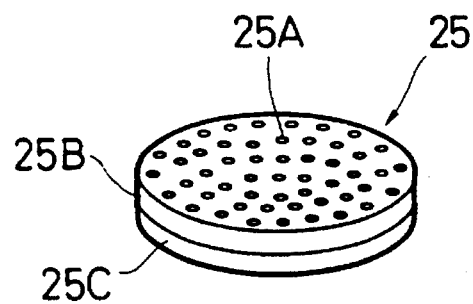

FIG. 5(A) is a magnified partial sectional view showing the ion extracting electrode disposed in the etching system of the fourth embodiment according to the present invention and FIG. 5(B) is a rough perspective view showing the overall appearance of the ion extracting electrode.

In the etching system of this embodiment, an ion extracting electrode 25 shown in FIG. 5 is provided between the plasma chamber 20 and the charge exchange chamber 22 and a neutralizer 42 comprising a tungsten filament for neutralizing space charge is provided at the ion extraction side and the other construction is substantially the same as the etching of the first embodiment.

In this embodiment, the ion extracting electrode 25 is formed with a multilayer plate of double construction comprising a glass (dielectric) layer 25B and an aluminum (metal) layer 25C, provided with many openings 25A for the extraction of ions, and the glass layer 25B is disposed on the side of the plasma chamber 20.

In this embodiment, the ion extracting electrode 25 is formed with the multilayer plate of double construction and therefore the ion extraction efficiency could be improved several times better than that in the first embodiment and, in addition, ions are prevented from direct contact with the aluminium layer 25C and therefore the service life of the ion extracting electrode 25 could be extended ten times or more.

Since the space charge is neutralized by the neutralizer 42 at a position where ions are extracted from the ion extracting electrode 25, the ion extraction efficiency could be improved and the divergence of the beams could be prevented.

Figure 6:
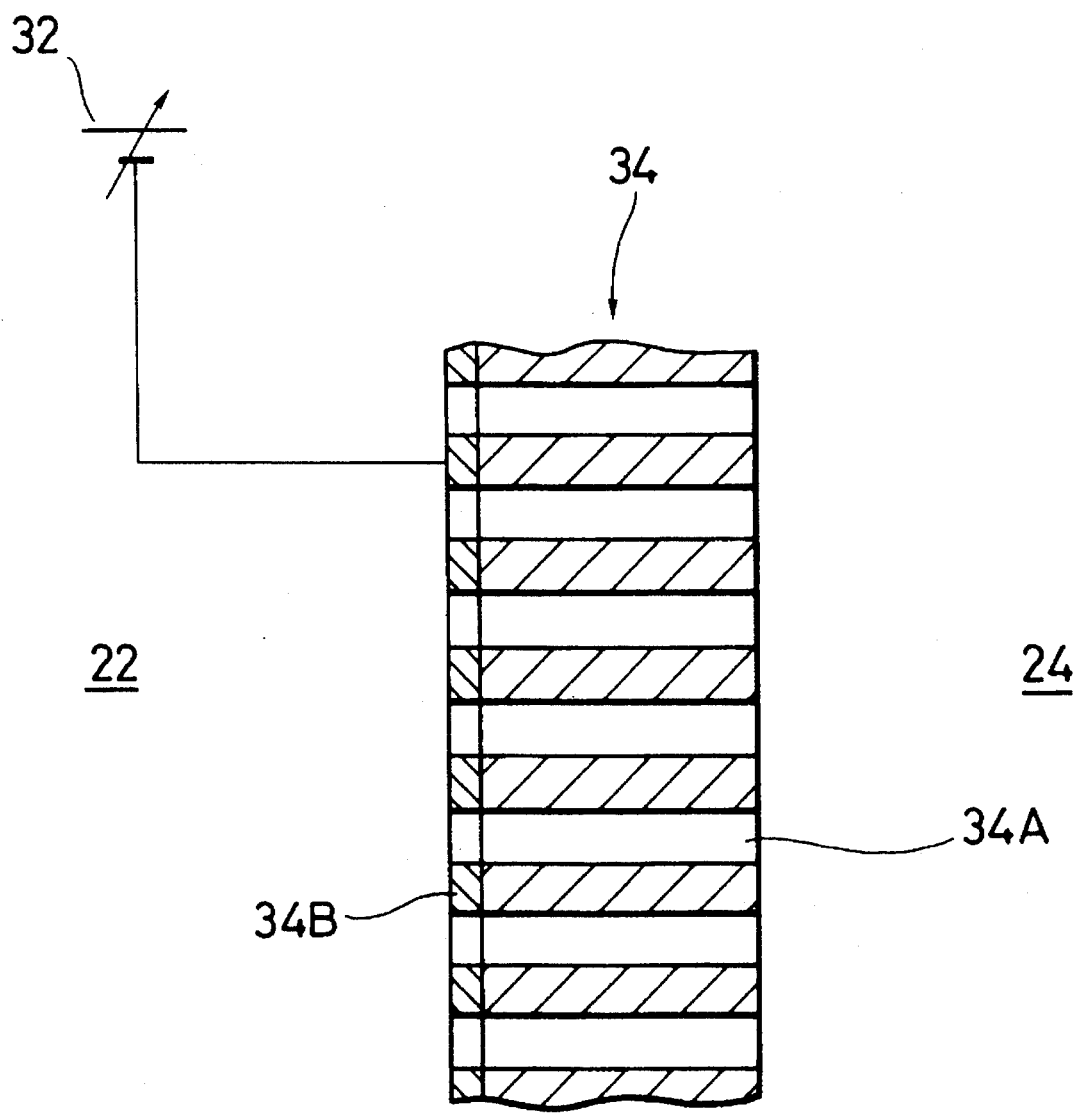
FIG. 6 is a magnified partial sectional view showing the principal part of the plasma processing system of the fifth embodiment according to the present invention.

FIG. 6 is a magnified partial sectional view showing part of the microchannel plate adapted to the etching system of the fifth embodiment according to the present invention.

The etching system of this embodiment is substantially the same as the etching system of the first embodiment except that the microchannel plate 34 has a surface electrode 34B which is formed by evaporation-depositing the surface of the microchannel plate at the charge exchange chamber 22 side with a metal such as aluminium, the ion removing electrode 30 is eliminated and the surface electrode 34B is connected to the power supply 32.

This embodiment allows the surface electrode 34B to function as the ion repellent electrode and therefore makes the etching system further compact.

The surface electrode 34B can be formed on the surface of the processing chamber 24 side. As a matter of course, the microchannel plate 34 in this embodiment can apply to the etching system of the third embodiment.

Figure 7:
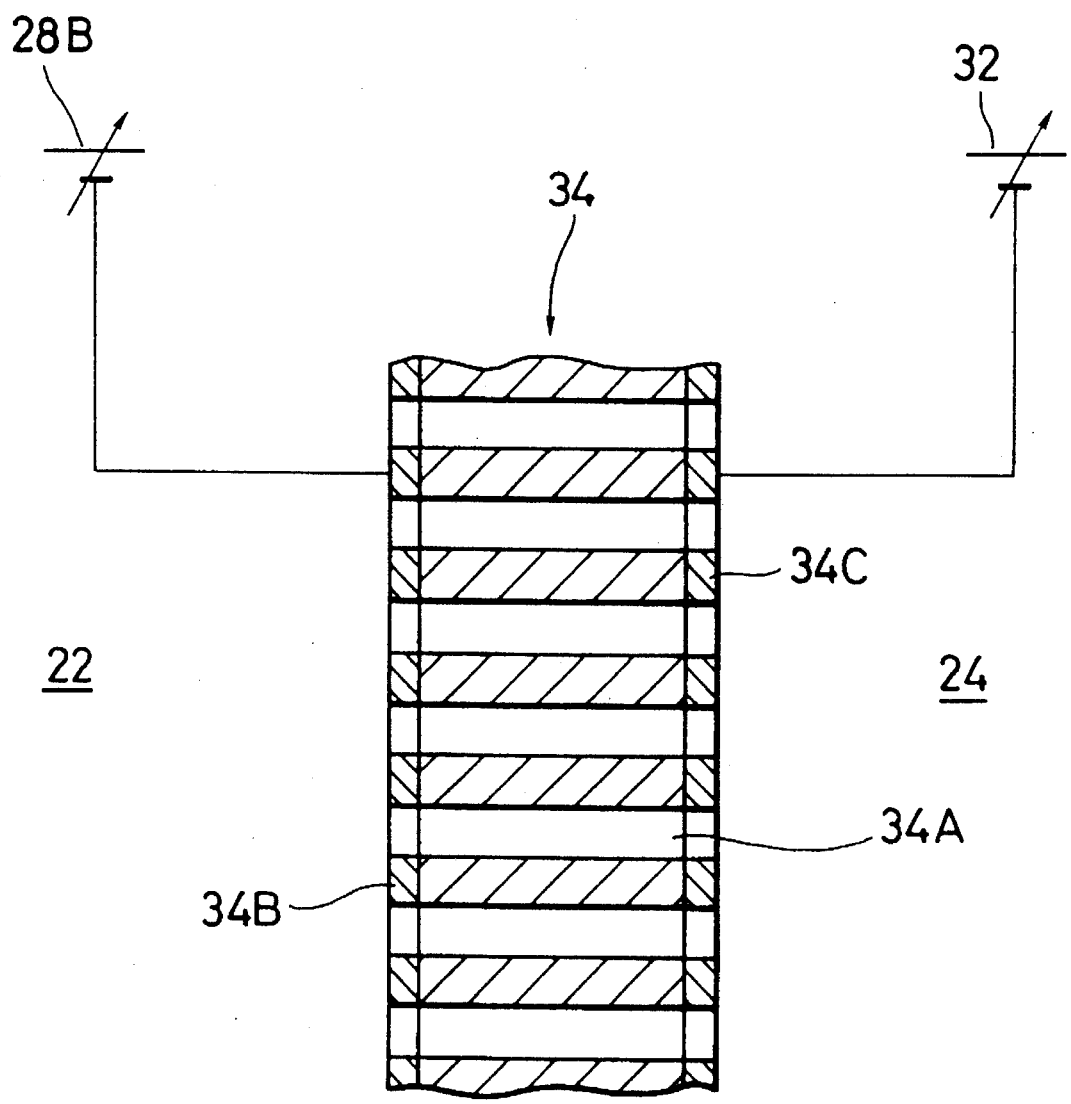
FIG. 7 is a magnified partial sectional view showing the principal part of the plasma processing system of the sixth embodiment according to the present invention.

FIG. 7 is a magnified partial sectional view showing part of the microchannel plate applied to the etching system of the sixth embodiment according to the present invention.

The etching system of this embodiment is substantially the same as the etching system of the first embodiment except that the microchannel plate 34 has the first surface electrode 34B and the second surface electrode 34C on both surfaces, the accelerating electrode 26 and the ion repellent electrode 30 are eliminated, the first surface electrode 34B is connected to the power supply 28B and the second surface electrode 34C is connected to the power supply 32.

This embodiment enables the above first surface electrode 34B to function as an accelerating electrode and the above second surface electrode 34C to function as an ion repellent electrode and therefore the etching system can be made further compact as compared with the etching system of the above fifth embodiment.

As a matter of course, the microchannel plate 34 according to this embodiment can apply to the etching system of the above third embodiment.

Figure 8:
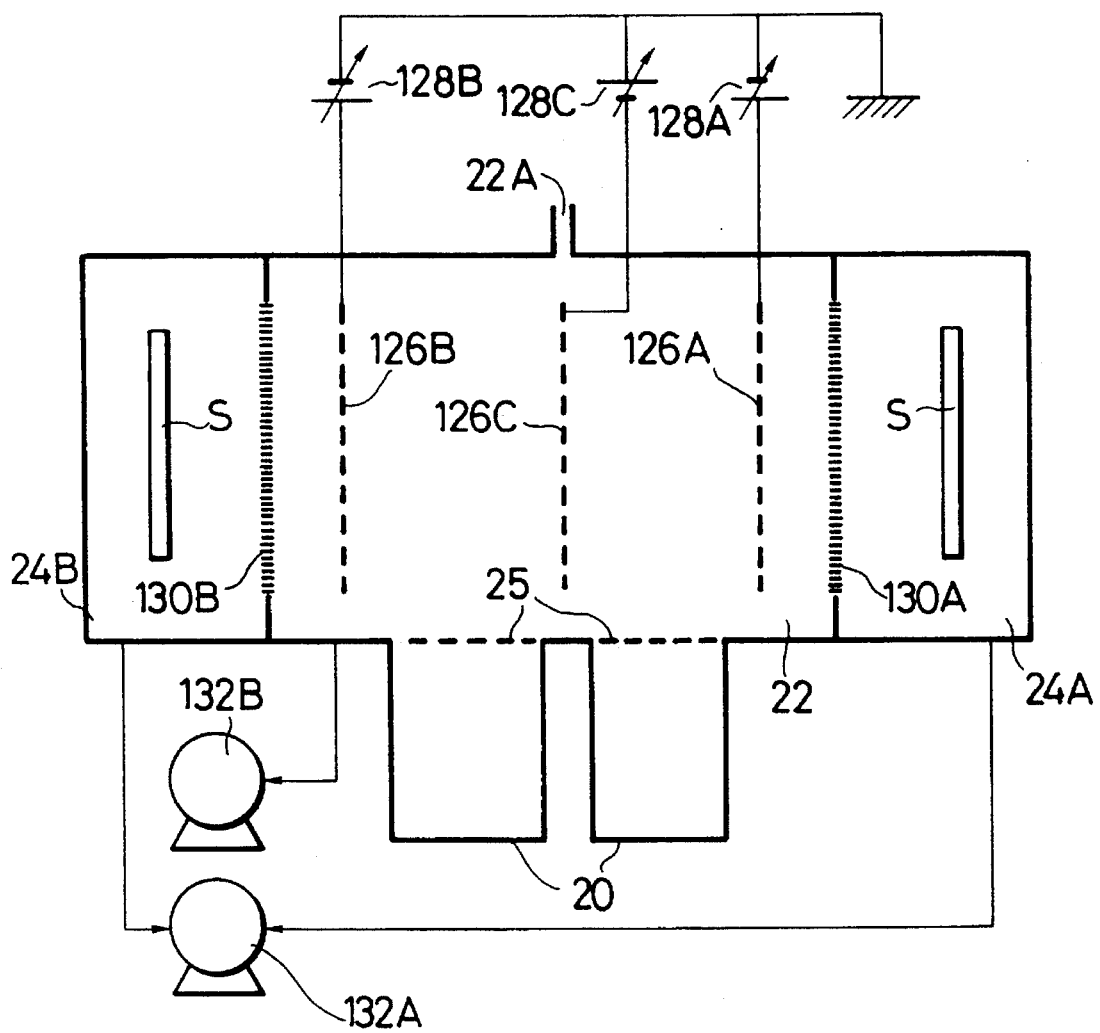
FIG. 8 is a rough configuration diagram showing the plasma processing system of the seventh embodiment according to the present invention.

FIG. 8 is a rough construction diagram showing the etching system of the seventh embodiment according to the present invention.

The etching system of this embodiment is provided with a plasma chamber (ion source) 20 having plasma generating means (not shown), a charge exchange chamber 22 for neutralizing positive ions generated in the plasma chamber 20 through charge exchange and generating neutral particles such as radicals, and two processing chambers 24A and 24B which are arranged at both sides of the charge exchange chamber 22 to carry out etching (plasma processing) of an object S with the neutral particles generated by the charge exchange reaction.

The plasma chamber 20 is provided with the gas supply port (not shown) for supplying gas which is a plasma material.

The ion extracting electrode (grid electrode) 25, which is made of graphite for extracting ions from the plasma chamber 20 to the charge exchange chamber 22, is provided between the plasma chamber 20 and the charge exchange chamber 22.

In the charge exchange chamber 22, the gas supply port 22A, which supplies gas for charge exchange, is provided, the first, second and third mesh electrodes 126A, 126B and 126C, which form the ion velocity control means for controlling the velocity of positive ions extracted from the plasma chamber 20, are installed opposing each other with the specified distance, and the ion control power supplies 128A, 128B and 128C capable of applying a desired voltage to control the velocity of ions are connected between these first to third mesh electrodes 126A to 126C. These first to third mesh electrodes 126A to 126C can be grid electrodes made of graphite as the ion extracting electrode.

A porous plate (microchannel plate) 130A is provided between the charge exchange chamber 22 and the processing chamber 24A to partition these chambers, and the pressures of both chambers 22 and 24A can be independently adjusted by this microchannel plate 130A and vacuum pumps 132a and 132B which are separately provided. Therefore, the pressure of the charge exchange chamber 22 can be set higher than the pressure of the processing chamber 24A and, at the same time, the microchannel plate 130A can allow the neutral particles generated by the charge exchange chamber 22 to pass through it into to the processing chamber 24A. The other processing chamber 24B is partitioned from the charge exchange chamber 22 with the microchannel plate 130B and is constructed to have similar functions.

Figure 2:
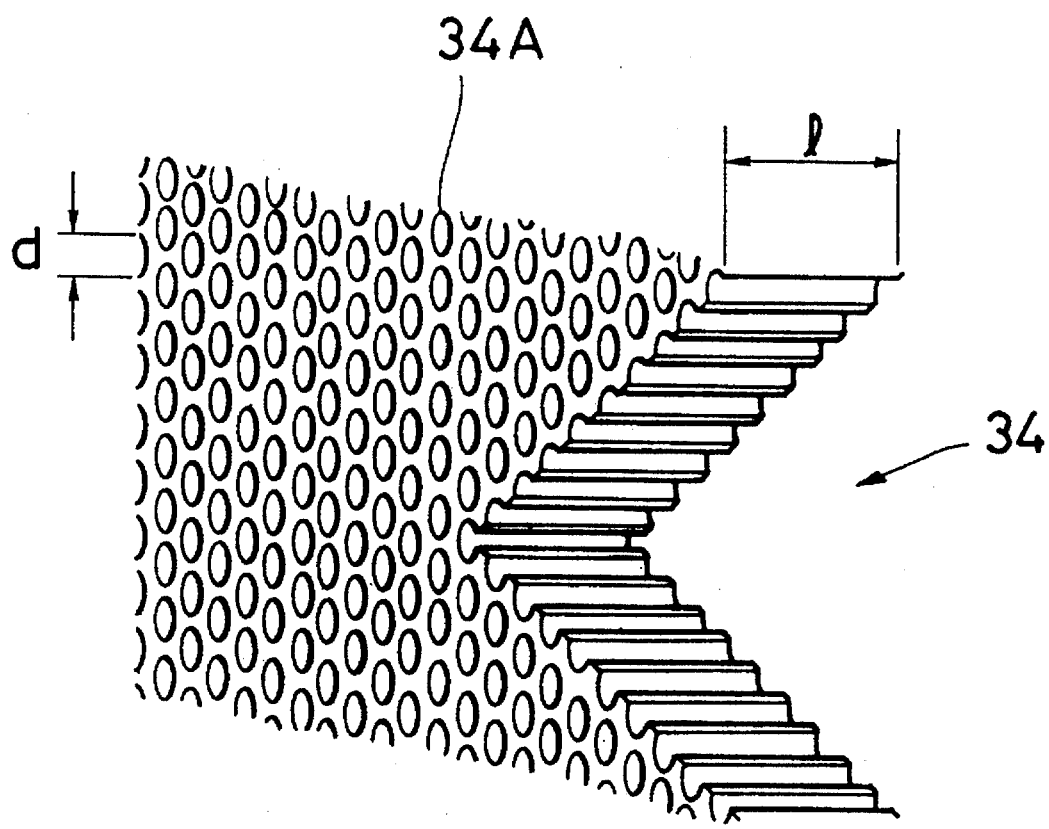
FIG. 2 is a partial perspective view showing magnified part of the principal component of the above etching system.

The above microchannel plates 130A and 130B are the same as shown in FIG. 2 and allow the neutral particles such as radicals to pass through the linear microchannel holes (fine through holes) 34A, which extend in the direction of the thickness of the microchannel plate, from the charge exchange chamber 22 to both processing chambers 24A and 24B. The pressures of the charge exchange chamber 22 and the processing chambers 24A and 24B can therefore be independently controlled.

The operation of this embodiment is described below.

A gas such as chlorine gas ($Cl_2$) is supplied as a plasma material from the gas supply port to the plasma chamber 20 to set a condition where plasma can be generated in the plasma chamber 20. The pressure of the charge exchange chamber 22 is set higher than the pressure of the processing chamber 24. A positive bias voltage is applied to the first and second mesh electrodes 126A, and 126B and a negative bias voltage is applied to the third mesh electrode 126C, thus a specified field is applied across the mesh electrodes, and a plasma is generated in the plasma chamber 20.

Positive ions in the plasma are extracted to the charge exchange chamber 22 by the ion extracting electrode 25, accelerated between the third mesh electrode 126C and the first and second mesh electrodes 126A and 126B in the charge exchange chamber 22, reciprocated between the first and second mesh electrodes 126A and 126B, electrically neutralized by charge exchange during the above processes and changed to high speed neutral particles which are direction-aligned.

In this case, the ions which do not have a translation energy are produced by the charge exchange reaction in the charge exchange chamber 22. These ions can be efficiently transformed to neutral particles by accelerating such ions with the third mesh electrode 126C and reciprocating the ions between the first mesh electrode 126A and the second mesh electrode 126B to carry out again the charge exchange. The neutralization efficiency is thus vastly improved and the density of neutral particles is raised.

Neutral particles generated by the charge exchange chamber 22 are accelerated and moved in the directions of the microchannel plates 130A and 130B to pass through respective microchannel holes 34A when their directions are roughly aligned, and therefore the directions are further aligned by the microchannel holes 34A. Consequently, neutral particles are introduced into both processing chambers 24A and 24B as a neutral particle beam with excellent directional alignment (high directionality). In this case, the microchannel holes 34A are formed to be normal to the microchannel plate 130A (130B). The neutral particle beam with high directionality can be irradiated vertically to the surface of the object S by arranging the object S to be normal to the microchannel holes 34A. Accordingly, high precision etching can be carried out simultaneously on the objects S to be processed which are disposed respectively in the processing chambers 24A and 24B.

In the charge exchange chamber 22, the first and second mesh electrodes 126A and 126B to which a positive bias voltage is applied are arranged at the sides of the processing chambers 24A and 24B and the introduction of ions into the processing chambers 24A and 24B can be certainly prevented. Consequently, the object S can be etched with complete neutral particles.

In this embodiment, the pressure of the charge exchange chamber 22 is set higher than the pressures of the processing chambers 24A and 24B and therefore the frequency of collision of ions with neutral particles composed of radicals and molecules in the charge exchange chamber 22 can be increased and the ion neutralization efficiency can be further improved.

Consequently, the conventional long flying distance of ions is unnecessary to obtain the ion neutralization efficiency of approximately 100% the length of the charge exchange chamber 22 in the flying direction of ions (the horizontal direction in the drawing) can therefore be reduced, and the charge exchange chamber 22 and further the etching system can be made compact.

After setting the object S to be processed, e.g. a silicon wafer on the surface of which an etching mask is mounted, at the specified positions of the processing chambers 24A and 24B, respectively, the etching system of this embodiment was employed. Chloride gas ($Cl_2$) was supplied from the gas supply port to generate the plasma, the pressure of the charge exchange chamber 22 was set to approximately $10^{-1}$ Torr and the pressures of the processing chambers 24A and 24B were held at approximately $10^{-3}$ Torr to prevent scattering of the beam.

Positive ions ($Cl^+$ and $Cl_2^+$) were extracted from the plasma chamber 20 to the charge exchange chamber 22 and the charge exchange reaction was caused to occur by reciprocating the ions between the first and second mesh electrodes 126A and 126B while accelerating the ions by the third mesh electrode 126C.

Consequently, a neutral particle beam with a low energy of several hundreds of eV could be generated by adjusting the voltage across the ion extraction electrode 25 and the first to third mesh electrodes 126A to 126C. The neutral particle beam was equally irradiated into the processing chambers 24A and 24B located at both sides of the charge exchange chamber 22. Accordingly, two objects S to be processed could be etched at the same time and the processing efficiency could be substantially improved.

The apparent neutralization efficiency (the percentage of neutral particles produced from one ion) in this case could be 100% or over despite that the system includes the charge exchange between different elements with a small cross section for charge exchange. In this case, the ions were returned to the inside of the charge exchange chamber 22 by the first and second mesh electrodes 126A and 126B and the ions were not irradiated into the processing chambers 24A and 24B.

Even though the length of the charge exchange chamber 22 in the direction where the ions are accelerated is a few centimeters, the apparent charge exchange efficiency could be close to 100% and, at the same time, high precision etching with high anisotropy could be carried out for the silicon wafer S by appropriately controlling the temperature of the wafer.

Figure 9:
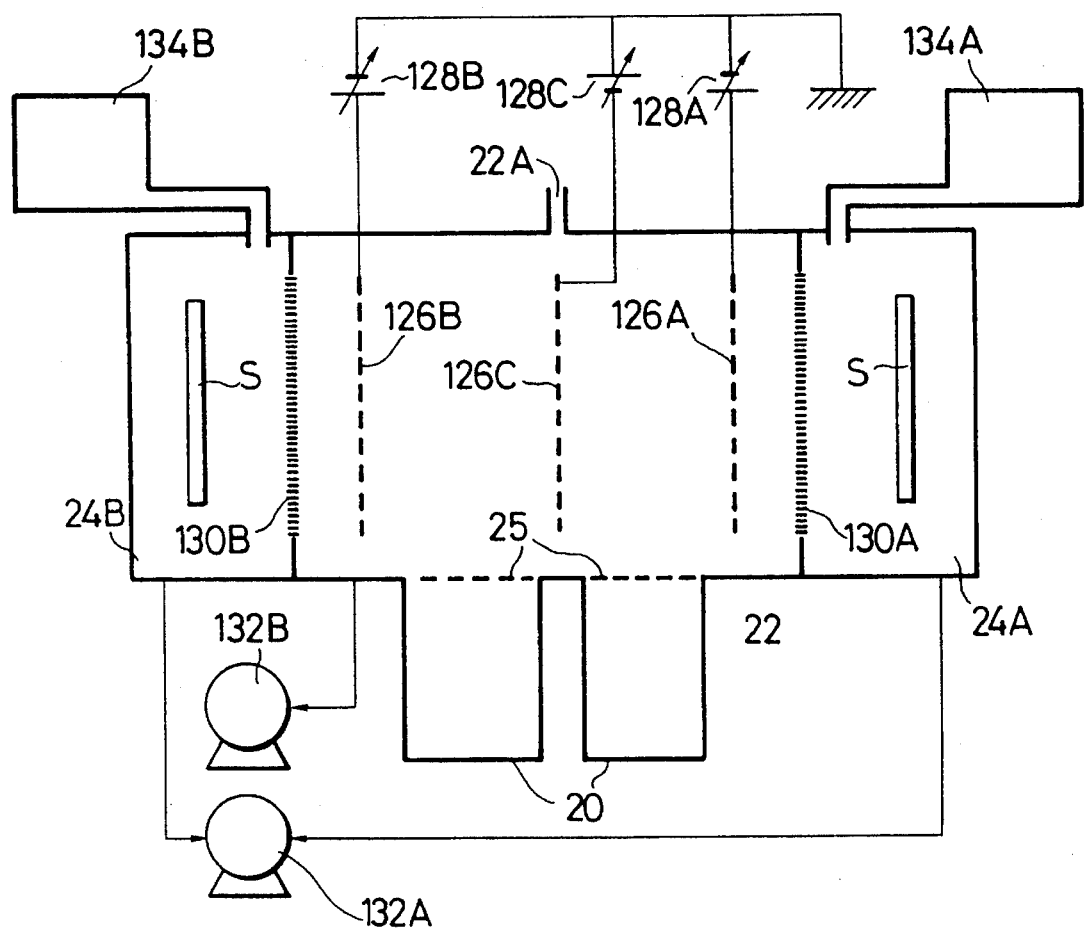
FIG. 9 is a rough configuration diagram showing the plasma processing system of the eighth embodiment according to the present invention.

FIG. 9 shows a rough construction of the etching system of the eighth embodiment according to the present invention.

The plasma processing system of this embodiment is substantially the same as the etching system of the seventh embodiment except that the processing chambers 24A and 24B are provided with radical supply sources 134A and 134B for supplying radicals such as Cl radical into the processing chambers 24A and 24B.

The above radical supply sources 134A and 134B allow to generate the radicals by dissociating the gas through microwave discharging. These radical supply sources 134A and 134B can be of a type capable of dissociating the gas by appropriate means such as light, heat or the like.

In this embodiment, chlorine gas was dissociated in the radical supply sources 134A and 134B by microwave discharging of 2.45 GHz, the Cl radical produced was adsorbed onto the surface of the silicon wafer S, chlorine gas was supplied from the gas supply port to the plasma chamber 20 and the etching was carried out under the conditions almost identical to those in the seventh embodiment.

According to this embodiment, the silicon wafer S can be etched with the Cl neutral particle beam while adsorbing the Cl radical onto the silicon wafer S and therefore the etching rate could be raised several times as high as that in the seventh embodiment.

The ion velocity control means for reciprocating the ions in the charge exchange chamber is not limited to the above described first to third mesh electrodes and means capable of providing similar functions is also permitted.

Figure 10:
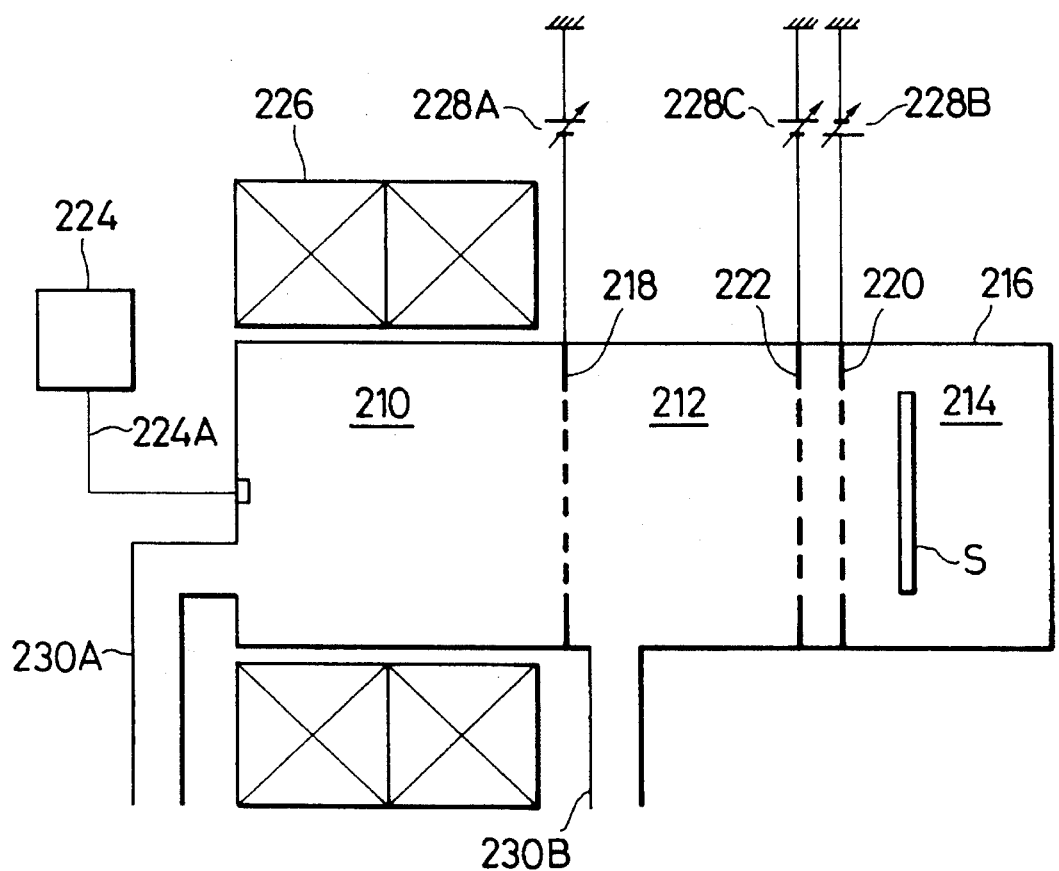
FIG. 10 is a rough configuration diagram showing the plasma processing system of the ninth embodiment according to the present invention.

FIG. 10 is a rough construction diagram showing the etching system of the ninth embodiment according to the present invention.

The etching system (plasma processing system) of this embodiment employs the ECR (Electron Cyclotron Resonance) plasma system and is provided with the ion source 210, the charge exchange zone 212 for neutralizing ions extracted from the ion source and the processing chamber 214 for etching (plasma processing) the object S by irradiating the neutral particles generated by the charge exchange zone 212, and is constructed as a vacuum chamber 216 as a whole.

The ion source 210 and the charge exchange zone 212 are partitioned by the ion extracting electrode 218 for extracting the ions from the ion source 210 to the charge exchange zone 212, and the charge exchange zone 212 and the processing chamber 214 are partitioned by the ion repulsion electrode 220 to prevent irradiation of ions into the processing chamber 214.

The charge exchange zone 212 is a space area in the vacuum chamber 216 partitioned by the ion extracting electrode 218 and the ion repulsion electrode 220, and the ion control electrode 222 for accelerating the ions generated by charge exchange reaction is provided at a position nearby the ion repulsion electrode 220 in the charge exchange zone 212.

A microwave source 224 is connected to the ion source 210 through the waveguide 224A and an electromagnetic coil 226 is disposed around the ion source 210.

DC variable power supplies 228A, 228B and 228C are connected to the ion extracting electrode 218, the ion repulsion electrode 220 and the ion control electrode 222, and a desired negative potential for extracting the ions from the ion source 210 is applied to the ion extracting electrode 218, a desired positive potential for preventing irradiation of ions from the charge exchange zone 212 into the processing chamber 214 is applied to the ion repulsion electrode 220 and a desired negative potential for accelerating low velocity ions generated in the charge exchange zone 212 is applied to the ion control electrode 222.

In this embodiment, the ion source 210 and the charge exchange zone 212 are respectively provided with gas supply tubes 230A and 230B which allow to independently supply material gas to the ion source 210 and charge exchange gas to the charge exchange zone 212.

The following describes the operation of this embodiment.

Material gas and charge exchange gas are supplied at specified flow rates from a gas reservoir (not shown) to the ion source 210 and the charge exchange zone 212. The pressures of the ion source 210, the charge exchange zone 212 and the processing chamber 214 are reduced to specified levels by vacuum means, (not shown), and the plasma is generated in the ion source 210 by the microwave source 224 and the electromagnetic coil 226.

A specified bias voltage is applied in advance to the ion extracting electrode 218, ion repulsion electrode 220 and ion control electrode 222, respectively. The ions produced by the ion source 210 are extracted with a fixed energy by the ion extracting electrode 218 to the charge exchange zone 212. These ions are changed to high speed neutral particles at the charge exchange zone 212 by the charge exchange reaction with charge exchange gas introduced from the gas supply tube 230. The high speed neutral particles are enter into the processing chamber 214 and are irradiated onto the object S stored in the processing chamber, and the object S is etched.

In this case, the low speed ions generated from neutral particles (charge exchange gas) through charge exchange reaction in the charge exchange zone 212 are accelerated by the ion control electrode 222 and new high speed neutral particles are further generated by charge exchange reaction. Therefore the density of the high speed neutral particle beam can be increased.

In this embodiment, since the system is constructed such that the material gas and the charge exchange gas can be independently supplied to the ion source 210 and the charge exchange zone 212, a combination of these gases can be set as required. Selection of an appropriate combination of both gases allows etching with high charge exchange efficiency and further a practical level of etching with the neutral particle beam to be implemented.

The following describes the results of etching actually made on a silicon wafer S using the above described etching system. The conditions for the plasma were set as shown below: the pressure was set to 1 milliTorr, the microwave power to 1 kW, the ion extracting electrode 218 to −50 V, the ion control electrode 222 to −80 V and the ion repulsion electrode 220 to +150 V.

It is presumed under these conditions that the ions will be extracted with an energy of approximately 50 eV from the ion source 210 to the charge exchange zone 212 and the kinetic energy of high speed neutral particles to be irradiated into the processing chamber 214 will be approximately 50 to 80 eV.

Under the above conditions, Ar, $F_2$, $Cl_2$, $Br_2$ and Xe were used as the gas species and the etching was carried out with required combinations of these gases as material gas to be supplied to the ion source 210 and charge exchange gas to be supplied to the charge exchange zone 212. The results thus obtained are shown in Table 1. Table 1 shows the cross section for charge exchange, that is, the charge exchange efficiencies when the etching was carried out under the above conditions and combinations of gases with the gas flow specified to be 50 sccm in all processings.

TABLE 1

| Ion | Neutral particle | | | | |
| --- | --- | --- | --- | --- | --- |
|  | Ar (16) | $F_2$ (15.7) | Xe (12.1) | $Cl_2$ (11.5) | $Br_2$ (10.5) |
| $F^+$ (17) | 0.8 | 0.8 | 6.0 | 9.4 | 16.9 |
| $Ar^+$ (16) | 1.0 | 1.0 | 7.0 | 10.4 | 18.5 |
| $Cl^+$ (13) | 0.3 | 0.3 | 2.1 | 3.1 | 5.7 |
| $Xe^+$ (12.1) | 0.25 | 0.25 | 1.7 | 2.5 | 4.5 |
| $Br^+$ (11.8) | 0.2 | 0.2 | 1.4 | 2.0 | 3.6 |

The ionization potential value (eV) is shown in ( ).

Table 1 indicates that the etching speed in the case when $Cl_2$ (in Table 1, the ion source corresponds to $Cl^+$) is used as the material gas and Ar, $Cl_2$ and $Br_2$ are used as the charge exchange gas (in Table 1, corresponding to the neutral particle) is 150, 300 or 800 angstrom/min, and a higher etching speed is obtained in accordance with the charge exchange efficiency.

As described above, this embodiment allows the etching under a desired combination of material gas and charge exchange gas and therefore substantially improves the charge exchange efficiency by appropriately setting a combination of gases and etching with a neutral particle beam.

In addition, the charge exchange efficiency can be vastly raised by combining a larger ionization potential of material gas than that of charge exchange gas.

Figure 11:
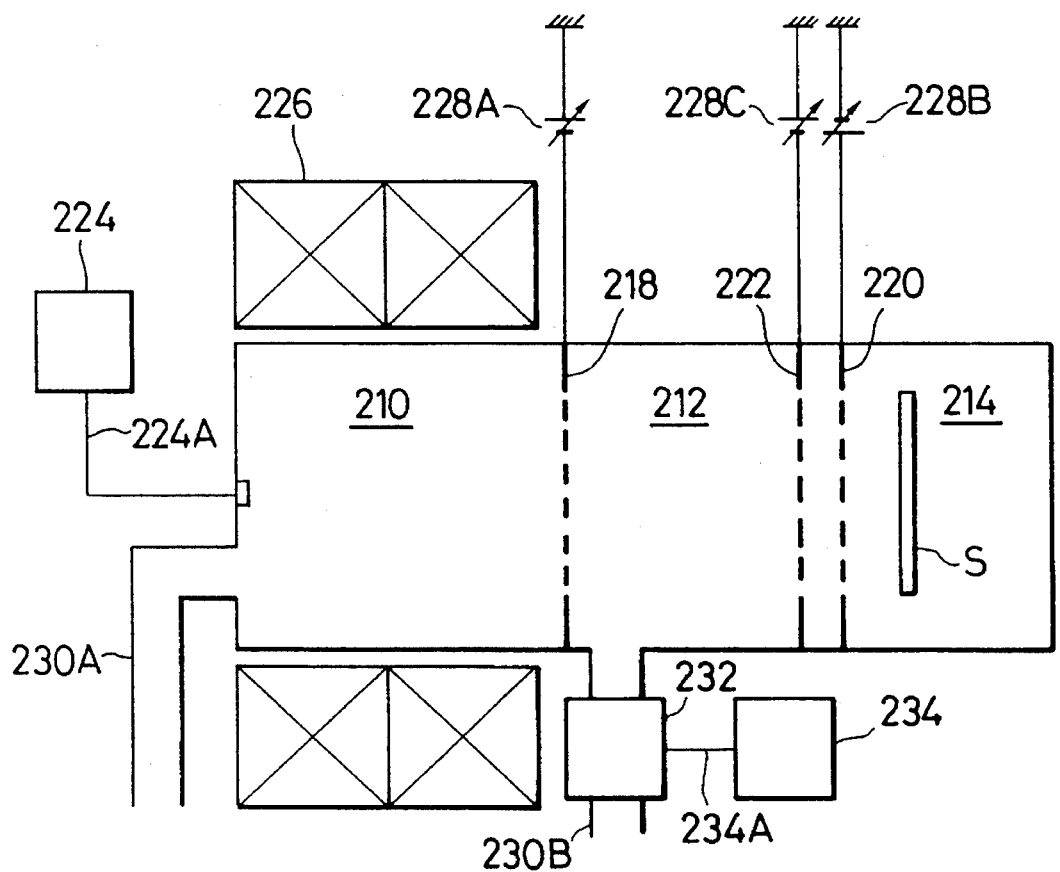
FIG. 11 is a rough configuration diagram showing the plasma processing system of the tenth embodiment according to the present invention.

FIG. 11 is a rough construction diagram showing the etching system of the tenth embodiment according to the present invention.

The etching system of this embodiment is substantially the same as the etching system of the above ninth embodiment except that a microwave plasma source (exciting means) 232 is provided for the gas supply tube 230B connected to the charge exchange zone 212 and a microwave source 234 is connected to the microwave plasma source through the waveguide 234A.

The etching system of this embodiment allows the movement of the charge exchange gas excited by the plasma source 232 to the charge exchange zone 212, substantially improves the charge exchange efficiency, since material gas can be made to have a higher ionization potential than charge exchange gas even when, for example, both material gas and charge exchange gas are the same kind of gas, and greatly increases the etching speed.

In the etching with the system of this embodiment under the same conditions as the above ninth embodiment, the etching speed was raised two times as high as that in the ninth embodiment in any combination of gases.

Though the ion control electrode 222 is provided in the ninth and tenth embodiments, this ion control electrode 222 is not always required. If this electrode is not provided, low speed ions will not be re-accelerated. However, the present invention ensures an extremely high charge exchange efficiency and therefore a sufficient amount of high speed neutral particles can be generated by one charge exchange reaction.

Figure 12:
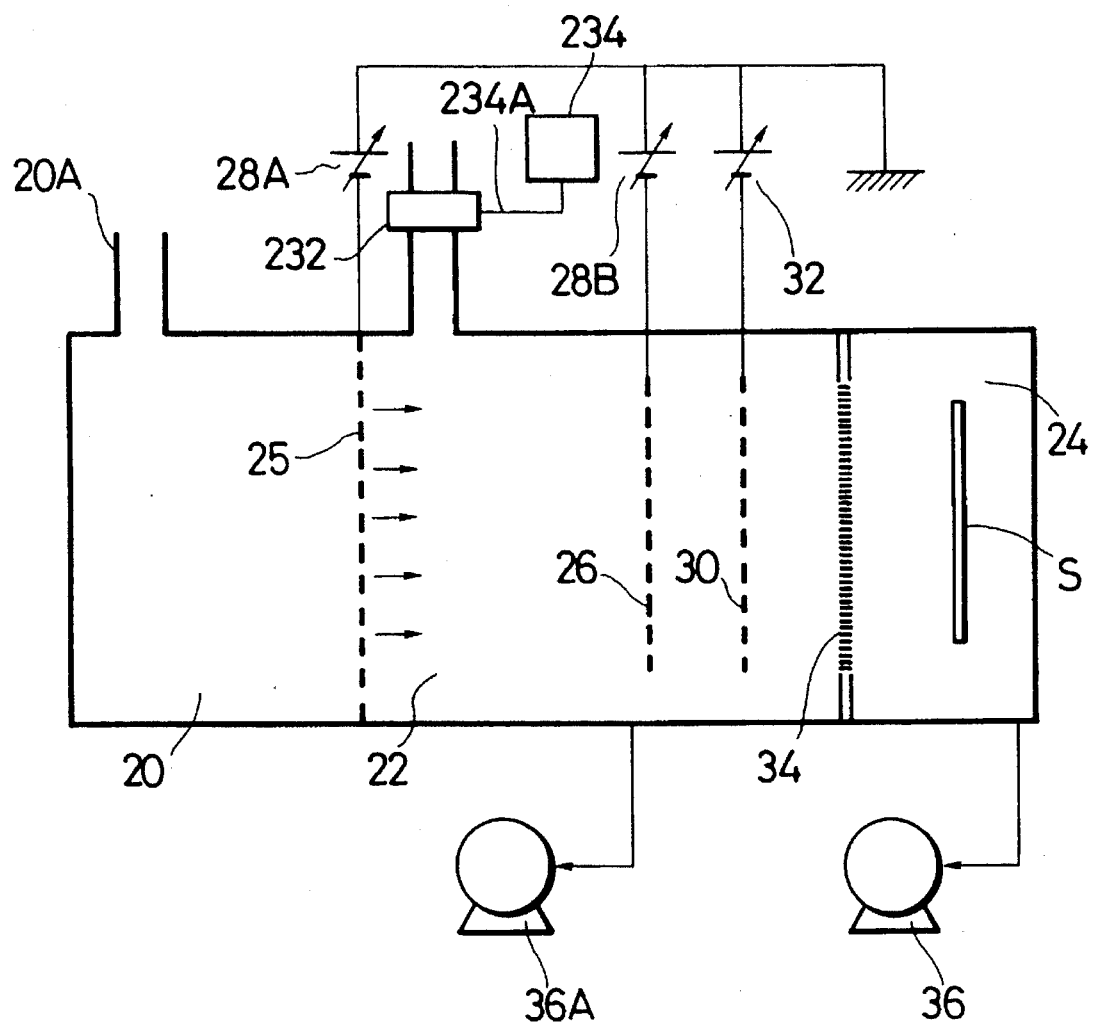
FIG. 12 is a rough configuration diagram showing the plasma processing system of the eleventh embodiment according to the present invention.

FIG. 12 is a rough configuration showing the etching system of the eleventh embodiment according to the present invention.

The etching system of this embodiment is substantially the same as the etching system of the first embodiment except that the microwave plasma source (exciting means) 232 is provided for the gas supply port 22A connected to the charge exchange chamber 22 and the microwave source 234 is connected to the microwave plasma source 232 through the waveguide 234A.

The etching system of this embodiment allows the movement of the charge exchange gas excited by the plasma source 232 to the charge exchange chamber 22, substantially improves the charge exchange efficiency since material gas can be made to have a higher ionization potential than charge exchange gas, and greatly increases the etching speed.

In the etching with the system of this embodiment under the same conditions as the above first embodiment, the etching speed was raised two times as high as that in the first embodiment.

Using the etching system of this embodiment, the etching was carried out with the material gas to be supplied to the plasma chamber 20 through the gas supply port 20A as a gas with a higher ionization potential than the charge exchange gas to be supplied to the charge exchange chamber 22 through the gas supply port 22A.

The etching was carried out under substantially the same conditions as in the first embodiment except that argon (At) was used as the material gas and chlorine ($Cl_2$) as the charge exchange gas.

This etching method allows to greatly improve the charge exchange efficiency and further vastly increases the etching speed.

In actual etching under the above described conditions, the etching speed was raised three times as high as in the first embodiment.

The combination of material gas and charge exchange gas is not limited to that in this embodiment and can be determined as desired.

The exciting means is not limited to the microwave and can be a type capable of exciting gas by appropriate means such as light and heat.

Figure 13:
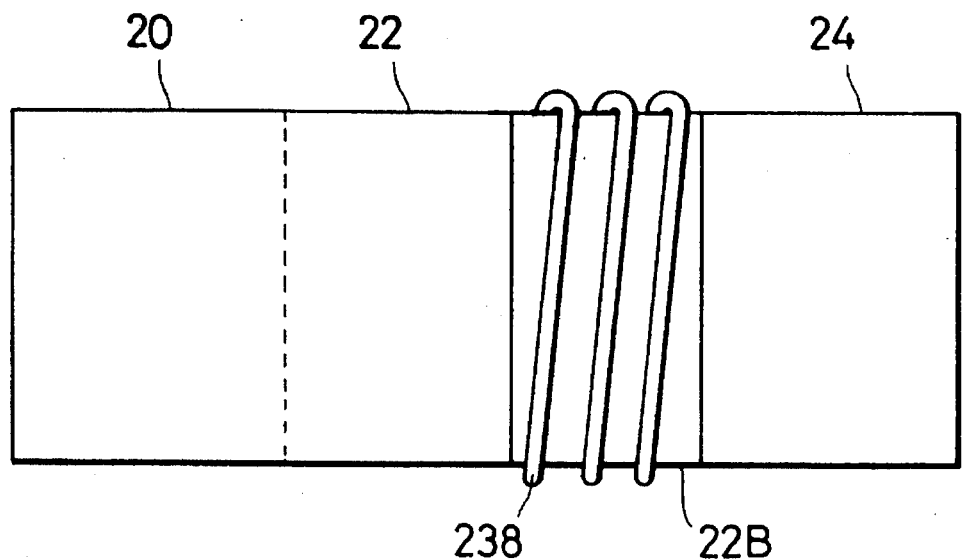
FIG. 13 is a rough front view showing the plasma processing system of the twelfth embodiment according to the present invention.
Figure 14:
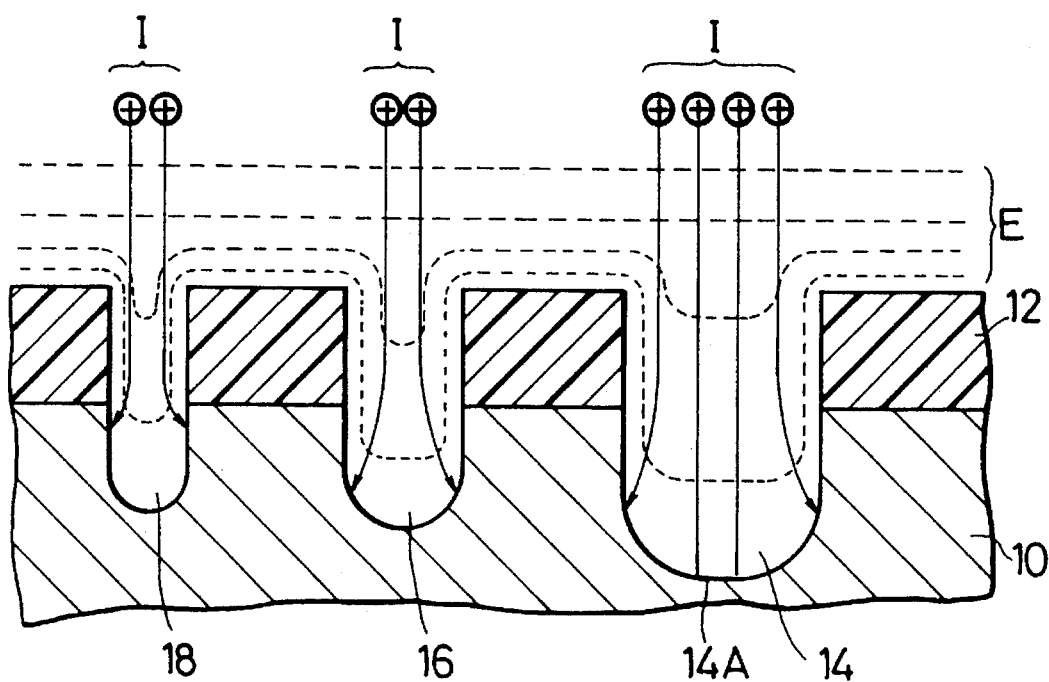
FIG. 14 is a rough illustration showing the conventional problems.

FIG. 13 is a rough front view conceptually showing the etching system of the twelfth embodiment according to the present invention.

In case of the etching system of this embodiment, the plasma chamber 20, charge exchange chamber 22 and processing chamber 24 are formed, as a whole, in a substantially tubular shape as illustrated in FIG. 13, which shows the outline of the external profile, the periphery of the charge exchange chamber 22 is partly formed with a quartz glass 22B and the xenon lamp (neutral particle exciting means) 238 is provided on the outer periphery of the quartz glass 22B. Other configurations of the system are substantially identical to the etching system of the first embodiment (FIG. 1).

The following describes the operation of this embodiment.

A gas such as chlorine ($Cl_2$) is supplied as plasma material from the gas supply port 20A to the plasma chamber 20 to generate a plasma in the plasma chamber 20 as in the first embodiment and, at the same time, the xenon lamp 238 is started to irradiate inside the processing chamber 24 with the xenon lamp 238.

Positive ions in the plasma that are extracted by the ion extracting electrode 25 in the arrow direction and accelerated by the accelerating electrode 26 in the charge exchange chamber 22 move into the processing chamber 24. The ions are electrically neutralized by charge exchange during the above movement and become high speed direction-aligned neutral particles.

Neutral particles that are generated in the charge exchange chamber 22 and excited by the xenon lamp 238, move in the direction of the microchannel plate 34 under the condition that the neutral particles are roughly direction-aligned and pass through the microchannel 34A. Therefore the neutral particles are roughly further direction-aligned by the microchannel holes 34A, consequently, extremely direction-aligned (high directionality) particles are introduced into the processing chamber 24 as a neutral particle beam with high internal energy.

In this case, since the microchannel holes 34A are perpendicularly formed in the microchannel plate 34, the neutral particle beam with high directionality can be entered perpendicularly to the surface of the object S to be processed by arranging the object S normal to the microchannel holes 34A. Accordingly, high precision etching of the object S similar to the first embodiment can be done at an extremely high speed.

In the use of the etching system of this embodiment, a silicon wafer was set as the object S to be processed at the specified position of the processing chamber 24 and the etching for a polysilicon layer on the wafer was conducted using an oxidized film as the mask as described below.

Chlorine ($Cl_2$) gas was supplied from the gas supply port 20A to generate the plasma, the charge exchange chamber 22 was set to approximately $10^{-1}$ Torr, the processing chamber 24 was held at approximately $10^{-3}$ Torr to prevent scattering of the beam, positive ions ($Cl^+$, $Cl_2^+$) from the plasma chamber 20 were accelerated and extracted to the charge exchange chamber 22, the charge exchange reaction was made to occur while the ions were being accelerated by the accelerating electrode 26, and the neutral particles generated were made to be excited state by an energy from the xenon lamp 238.

The practical conditions adopted for excitation are such that a Hg—Xe lamp is used as a light source, the energy is 300 mW/cm$^2$ at the outer periphery of the charge exchange chamber and the main wavelength of the incident beam into the charge exchange chamber is 300 to 400 nm.

Consequently, the neutral particle beam which was excited to have a high internal energy, despite that the translation energy was as low as several hundreds of eV, could be generated by adjusting the voltage across the ion extracting electrode 25. The accelerating electrode 26 and the output of the xenon lamp 238 and therefore the etching rate could be raised approximately ten times as high as that when the neutral particles are not excited, and vertical etching shapes could thus be obtained without undercuts.

The etching system of the thirteenth embodiment according to the present invention is described below.

The plasma processing system of this embodiment is substantially the same as the twelfth embodiment except for the system configuration. The xenon lamp 238 disposed around the quartz glass 22B is substantially the same as the third embodiment (FIG. 4) in which the radical supply source 40 for supplying radicals such as Cl radical is provided in the processing chamber 24.

In this embodiment, chlorine gas was dissociated by microwave discharging of 2.45 GHz at the radical supply source 40. The Cl radical generated was adsorbed onto the surface of the silicon wafer (object to be processed) S, the chlorine gas was supplied from the gas supply port 20A to the plasma chamber 20, and the etching was carried out under the same conditions as in the first embodiment.

This embodiment allows etching of the silicon wafer S with the neutral particle beam of Cl while adsorbing the Cl radical onto the silicon wafer S and therefore the etching rate could be raised as several times high as that in the twelfth embodiment.

The above has specifically described the present invention. However, the present invention is not limited to the above described embodiments and is variably available without deviation from the spirit and scope of the invention.

For example, the ion extracting electrode 25 shown in FIG. 5 and applied to the fourth embodiment and the microchannel plate 34 applied to the fifth and sixth embodiments can apply to the etching system of other embodiments.

The neutral particle exciting means is not limited to the xenon lamp 238 shown in the above embodiments and, for example, eximer laser, heat, microwave or electron beam can be used as other exciting means.

An ion collecting electrode can be used. This ion collecting electrode, which can be replaced for the ion repellent electrode, is installed on the internal wall of the system between the accelerating electrode and the microchannel plate and can be negative-biased in reference to the accelerating electrode.

The neutralizer shown in the fourth embodiment is not limited to the coil type and its shape can be changed as desired. For example, the neutralizer can be a linear wire made of tungsten disposed in the radial direction of the ion extracting electrode.

The above neutralizer can apply to other embodiments as well as the fourth embodiment.

Plasma material is not limited to chlorine and plasma generating means is not limited.

Pressure Pa of the charge exchange chamber need not be larger than pressure Pb of the processing chamber and can be almost equal to the latter.

The plasma processing system of the present invention is not limited to the etching system and can apply to other plasma processings.

For example, the plasma processing system of the present invention, which is effective as a film forming system, allows to obtain highly fine and high quality films with less damage and stress and has proven highly useful.

What is claimed is:

1. A plasma processing system comprising:
    a plasma chamber having plasma generating means, and provided with a material gas supply port through which a material gas is introduced and ionized in said plasma chamber,
    a charge exchange chamber provided with a charge exchange gas supply port through which charge exchange gas is introduced in said charge exchange chamber for neutralizing ions generated by said plasma chamber by charge exchange reaction through a collision with the charge exchange gas, and
    a processing chamber for processing an object to be processed by irradiating neutral particles which are neutralized in said charge exchange chamber, wherein said charge exchange chamber and said processing chamber are partitioned with a dielectric porous plate provided with a number of linear microchannel holes having a diameter from 2 μm to 200 μm and a length from 200 μm to 5 mm, wherein said porous plate maintains a pressure differential between said charge exchange chamber and said processing chamber, wherein said neutral particles pass from said charge exchange chamber to said processing chamber through said microchannel holes, and wherein said neutral particles are aligned and focused onto said object.

2. A plasma processing system in accordance with claim 1, further comprising one each of two vacuum pumps connected to each chamber for making the pressure of said charge exchange chamber higher than the pressure of said processing chamber.

3. A plasma processing system in accordance with claim 1, wherein said plasma chamber and said charge exchange chamber are respectively provided with gas supply ports from which material gas and charge exchange gas can be independently supplied to the plasma chamber and the charge exchange chamber, and said porous plate holds a pressure differential between the charge exchange chamber and the processing chamber.

4. A plasma processing system in accordance with claim 3, wherein said processing chamber is provided with a radical supply source.

5. A plasma processing system in accordance with claim 3, wherein the gas supply port provided at the charge exchange chamber is provided with exciting means for exciting the charge exchange gas.

6. A plasma processing system in accordance with claim 1, wherein said charge exchange chamber is provided with means for exciting neutral particles generated.

7. A plasma processing system in accordance with claim 1, wherein an electrode is formed at a side of said porous plate.

8. A plasma processing system in accordance with claim 1, wherein an electrode is formed at both sides of said porous plate.

9. A plasma processing system in accordance with claim 1, wherein an ion extraction electrode is formed with a multilayer plate comprising a dielectric and a metal in a double construction which is provided with an opening for extracting ion.

10. A plasma processing system in accordance with claim 1, wherein a neutralizer is provided in said charge exchange chamber.

11. A plasma processing system in accordance with claim 1, further comprising an apparatus for controlling the temperature of said object to be processed, said apparatus comprising heating means and cooling means.

12. A plasma processing system in accordance with claim 1, wherein a processing chamber is arranged at both sides of the charge exchange chamber.

13. A plasma processing system in accordance with claim 1, wherein the material gas has a larger ionization potential than the charge exchange gas.

* * * * *